United States Patent
Ioffe et al.

(10) Patent No.: US 11,177,854 B2
(45) Date of Patent: Nov. 16, 2021

(54) METHOD FOR SIMULATING AN ANTENNA

(71) Applicant: APTIV TECHNOLOGIES LIMITED, St. Michael (BB)

(72) Inventors: Alexander Ioffe, Bonn (DE); Jairo Escudero Torres, Cologne (DE); Markus Stefer, RS-Lennep (DE)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 16/912,855

(22) Filed: Jun. 26, 2020

(65) Prior Publication Data
US 2020/0412407 A1 Dec. 31, 2020

(30) Foreign Application Priority Data
Jun. 28, 2019 (EP) .................... 19183296

(51) Int. Cl.
*H01Q 19/10* (2006.01)
*H04B 1/72* (2006.01)
*H01Q 1/28* (2006.01)
*H01Q 1/42* (2006.01)

(52) U.S. Cl.
CPC ............. *H04B 1/72* (2013.01); *H01Q 19/10* (2013.01); *H01Q 1/28* (2013.01); *H01Q 1/42* (2013.01)

(58) Field of Classification Search
CPC . H04B 1/72; H01Q 19/10; H01Q 1/28; H01Q 1/42
See application file for complete search history.

(56) References Cited

U.S. PATENT DOCUMENTS 10,634,777 B2 * 4/2020 Oh .................. G01S 13/931

OTHER PUBLICATIONS

Extended European Search Report for Application No. EP 19183296.3 dated Jan. 3, 2020.
Altair Feko: "Numerical Methods in FEKO White Paper Instruction," Dec. 15, 2016, pp. 1-5, XP055651421, Retrieved from the Internet: URL:https://altairhyperworks.com/ResourceLibrary.aspx?keywords=methods&altair_products=Feko&category=All [retrieved on Dec. 10, 2019].

(Continued)

*Primary Examiner* — Joseph J Lauture
(74) *Attorney, Agent, or Firm* — Carlson, Gaskey & Olds

(57) ABSTRACT

A method for simulating electromagnetic interactions between an antenna with a reflecting front face and at least one electromagnetic radiator and an electrically large interaction structure placed in front of the antenna comprises providing an antenna model representing the antenna, the antenna model comprising an antenna surface representing the front face and at least one field source representing the at least one radiator, wherein the field source is placed at the antenna surface and is configured as a far field source that is defined by a predetermined radiation pattern, and wherein direct electromagnetic interaction between the field source and the antenna surface is avoided. The method further comprises determining electromagnetic radiation launched by the field source based on the predetermined radiation pattern, propagating the radiation using an asymptotic numerical method, and determining interactions of the radiation with the interaction structure and with the antenna surface.

18 Claims, 14 Drawing Sheets

(56) References Cited

OTHER PUBLICATIONS

Figure 1:
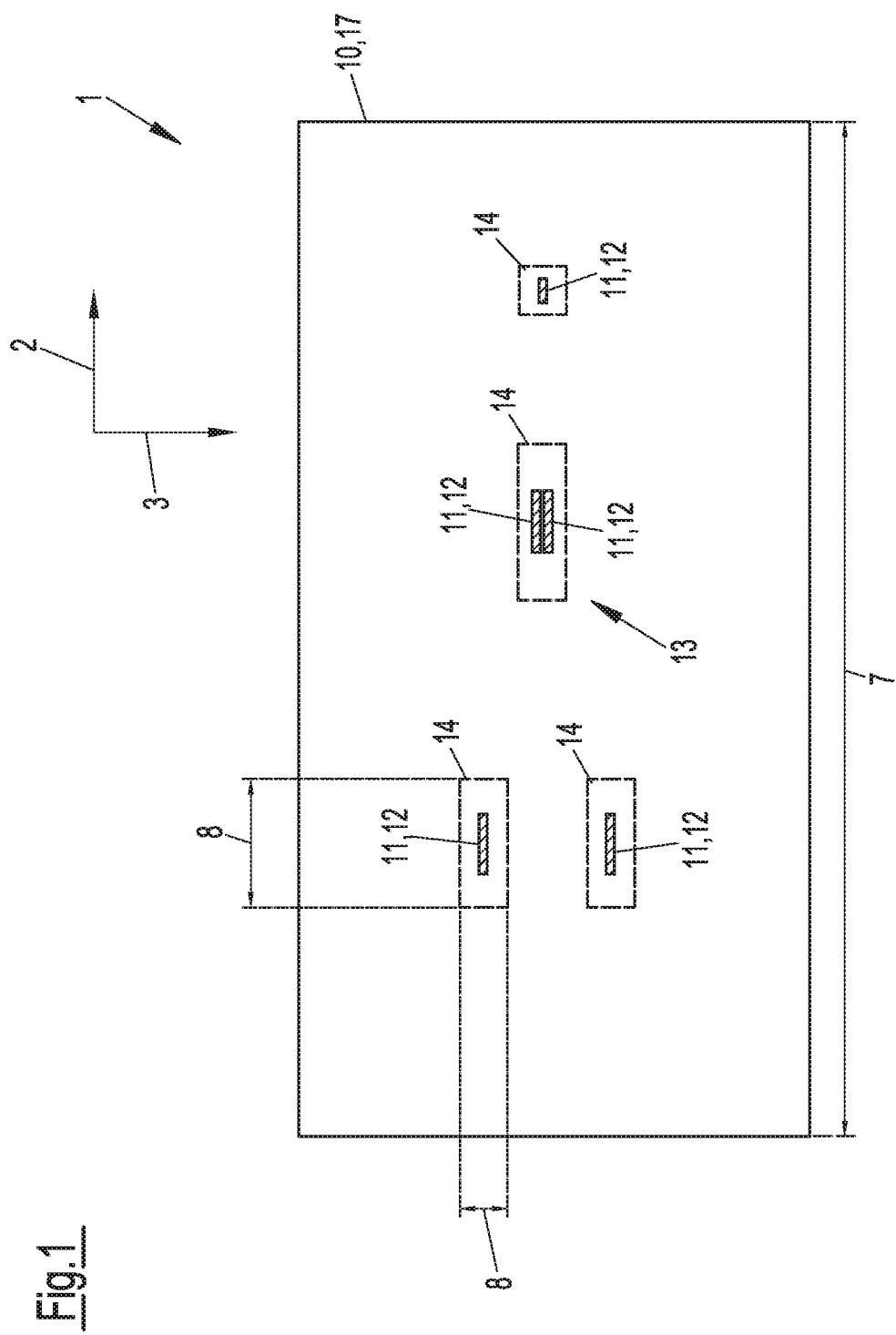

Lacik et al.: On Using Ray-Launching Method for Modeling Rotational Spectrometer, Radioengineering, vol. 17, Nr. 2, 2008, p. 98 ff., published by Brno University of Technology, Brno, ISSN 1805-9600.

Hao Ling, et al., Shooting and Bouncing Rays: Calculating the RCS of an Arbitrarily Shaped Cavity, IEEE Transactions on Antennas and Propagation, vol. 37, No. 2, Feb. 1989, pp. 194-205.

Chou, Asymptotic High Frequency Methods, Novel Technologies for Microwave and Millimeter—Wave Applications © Springer Science+Business Media New York 2004, pp. 425-460.

\* cited by examiner

METHOD FOR SIMULATING AN ANTENNA

FIELD

The present disclosure relates to a method for simulating electromagnetic interactions between an antenna and an electrically large interaction structure, a computer system for carrying out the method and a computer program for instructing a computer to perform the method.

BACKGROUND

The method of the present disclosure may be used in automotive applications for simulating antennas of radar devices of advanced driver assistance systems (ADAS). Antennas of such radar devices are typically installed behind plastic parts of the vehicle surface, for example next to or behind a bumper. To determine the performance and optimum placement of such vehicle integrated antennas, it is often desired to simulate the electromagnetic interaction of the antenna with the vehicle structure and the impact of the vehicle structure on the antenna performance.

Frequency ranges used for radar devices in automotive applications typically range from around 20 GHz to over 200 GHz, and the corresponding wavelengths of the radiation lie in the millimeter range. Consequently, vehicle structures surrounding the antennas of such devices typically represent electrically large structures. On the other hand, said vehicle structures may comprise comparably small features with dimensions in the order of the wavelength of the emitted radiation. For example, a bumper placed in front of the antenna may comprise several material layers, such as different painting layers, each having a thickness in the submillimeter range. Likewise, the antenna itself may comprise electrically small features such as different material layers of an electrode structure of the antenna or a radome of the antenna placed in front of the electrode structure. Although the distance of the bumper to the radar antenna is typically larger than the wavelength, it may be comparable to the size of the entire antenna so that the bumper may still be located in the near field region of the antenna.

A simulation method that is used to predict the performance of a vehicle integrated radar antenna therefore has to cope with both electrically large and electrically small structures in a single simulation model. When using full wave simulation methods this results in an extremely fine mesh at the fine structures of the bumper region and the antenna, which demands high computational resources for solving the resulting densely meshed model.

For the simulation of electrically large structures, asymptotic simulation methods have been developed that rely, e. g., on electromagnetic ray tracing using geometrical optics, or physical optics, or shooting and bouncing rays or the like. These asymptotic methods are mainly used to simulate scattering problems involving electrically large interaction structures. Physical effects of the rays at the boundaries of the interaction structures are thereby modelled by computing equivalent currents from the tangential fields that impinge on the surfaces and by determining rays that are reflected, refracted or transmitted by the surfaces from the determined equivalent currents using e. g. Huygens principle or the like.

Antennas used in automotive applications are often based on planar antennas like microstrip patch or slot antennas and may contain complex and spatially extended combination of those basic antennas. Additionally, those antennas often feature complex dielectric or metallic structures in the vicinity of individual radiating elements. As said structures are usually placed in the near field of the antenna, they cannot be easily modelled using asymptotic approximations designed for the far field region. As a consequence, if antennas used in automotive applications are simulated at all, then this is usually done using full wave field solvers demanding high computational resources, particularly when also including the interaction with electrically large structures placed in the near field of the entire antenna.

Accordingly, there is a need to accurately represent complex antennas in simulation models that are compatible with asymptotic field solvers.

SUMMARY

The present disclosure provides a method, a computer system and a non-transitory computer readable medium according to the independent claims. Embodiments are given in the dependent claims, the description and the drawings.

In one aspect, the present disclosure is directed at a method for simulating electromagnetic interactions between an antenna and an electrically large interaction structure placed in a radiation direction in front of the antenna, wherein the antenna comprises a reflecting front face and at least one radiating element. The method comprises providing, in a memory unit of the computer, an antenna model representing the antenna, the antenna model comprising an antenna surface representing the reflecting front face of the antenna and a field source representing at least one electromagnetic radiator of the antenna. The at least one electromagnetic radiator is defined as a part of the antenna that at least partly comprises the radiating element and that has dimensions that place the interaction structure in the far field region of the radiator. The field source is placed at the antenna surface, wherein the field source is configured as a far field source that is defined by a predetermined radiation pattern, and wherein a radiation field of the radiation pattern that is directed towards the antenna surface is at least approximately equal to zero so that direct electromagnetic interaction between the field source and the antenna surface is avoided. The method further comprises computing, with a processing unit of the computer, electromagnetic radiation launched by the field source based on the predetermined radiation pattern, propagating, with the processing unit of the computer, the radiation in the radiation direction using an asymptotic numerical method, and determining, with the processing unit of the computer, interactions of the rays with the interaction structure and with the antenna surface.

By avoiding direct electromagnetic interaction between the field source and the antenna surface, the predetermined radiation pattern of the field source is not altered by placing the field source at the antenna surface and the radiation extracted from the predetermined radiation pattern of the field source does not directly impinge on or interact with the antenna surface. The simulated radiation therefore accurately represents the radiation emitted by the actual antenna. As a consequence, the antenna model allows for accurate simulation of an antenna that comprises a reflecting front face, such as a planar antenna containing a set of (microstrip) patch radiators or slot radiators, using an asymptotic numerical method.

The method is a computer implemented method, wherein at least part of the steps of the method are performed by the processing unit and/or the memory unit of the computer, whereby the memory unit is linked to the processing unit. Compared to a method based on a full wave analysis, a simulation based on an asymptotic numerical method reduces the computational costs and thus the simulation time needed. For typical automotive applications, such as the simulation of interactions of a radar antenna with a vehicle bumper placed in front of the antenna, the simulation time may be reduced from several hours or days to the sub-hour range. In addition, multilayered interaction structures, such as painted bumpers, may be accurately represented within an asymptotic simulation without significant additional computational costs, for example as a multilayered thin dielectric sheet.

The antenna model and the method described herein therefore has the technical effect that it allows for accurate and efficient simulation of a surface antenna placed in front of an electrically large interaction structure. This has hardly been possible with known antenna models that do not suppress the radiation field of the field source along the antenna surface. As a further technical effect, the antenna model of the method described herein considerably reduces the computational costs needed for its implementation on a computer system when compared to full wave simulations.

With the antenna model and method described herein, the interaction structure may be positioned in the near field of the entire antenna. Additionally, or alternatively, the antenna including the reflecting front face may be electrically large with respect to the wavelengths of the radiation involved. In these cases, it would not be possible to model the entire antenna including its reflecting front face by a single far field radiation source, for example by one or several point sources that are adapted to reproduce the far field radiation pattern of the whole antenna including the front face. This is because such far field sources can only be used to accurately model interactions between the antenna and structures that are actually placed in the far field region of the entire antenna, not for modelling interactions between the antenna and structures within the near field of the antenna, such as the electrically large interaction structure of the present disclosure. For similar reasons, it would not be possible to represent the radiation field of the antenna by a superposition of spherical modes, as typical antenna geometries would require an inclusion of a large number of spherical modes that only accurately represent the antenna field at distances larger than the spacings between the antenna and typical interaction structures.

If the interaction structure is positioned in the near field of the entire antenna, it is therefore necessary to explicitly include both the interaction structure and the reflecting front face in the simulation model. According to the present disclosure, this can be done by representing the individual radiators of the antenna by far field sources that do not directly interact with or radiate towards the antenna surface that represents the front face of the antenna. This solution avoids unphysical distortions of the radiation fields of the field sources due to the proximity of the antenna surface as they may occur, for example, in simulation models that simply place conventional dipole sources in front of the antenna surface.

Direct interaction between the field source and the antenna surface may be avoided by configuring the predetermined radiation pattern in a way that a radiation field of the radiation pattern that is directed towards the antenna surface is at least approximately equal to zero. This results in a configuration in which the electromagnetic radiation launched by the field source does not directly impinge on the antenna surface and in which the radiation pattern does not radiate towards the antenna surface. The radiation launched by the field source then may only reach the antenna surface when being scattered by other objects of the interaction simulation model, for example by the interaction structure. Additionally, the radiation pattern may be configured in a way that any discontinuity of the radiation field along the antenna surface and also any backward propagation of the radiation field that is not present at the actual antenna to be simulated are avoided. For example, a radiation field of the radiation pattern that is directed towards or along the antenna surface may be equal to zero or at least essentially equal to zero.

The radiation pattern that is directed towards the antenna surface being at least approximately equal to zero means that a power density of the predetermined radiation pattern that is radiated towards the antenna surface is more than three times, for example more than five times, more than ten times, more than one hundred times, more than one thousand times, more than ten thousand times, more than on hundred thousand times or more than one million times smaller than the average power density radiated by the field source. The power density of the predetermined radiation pattern that is radiated towards the antenna surface may also be zero.

The antenna may be a vehicle integrated radar antenna. The antenna may be configured as a planar antenna having a planar electrode structure. Planar antennas provide high gain and low loss and are well suited for vehicle integration due to their small size and depth. A planar antenna may be, for example, configured as a patch antenna, such as a microstrip patch antenna, or as a slot antenna, such as a slotted waveguide antenna. Said slotted waveguide antenna may have a planar electrode structure comprising a substrate integrated waveguide (SIW).

The method for simulating electromagnetic interactions between the antenna and the interaction structure is performed using an interaction simulation model with a model geometry that comprises the antenna model and the interaction structure, which is represented by a structure model in the model geometry. Both the antenna model and the structure model are defined within the model geometry as assemblies of geometrical elements with predefined electromagnetic properties assigned to their surfaces and/or volumes. Additionally, the interaction model geometry may comprise more than one interaction structure for simulating electromagnetic interactions between the antenna and several interaction structures.

The field source is configured as a far field source and the predetermined radiation pattern may represent the far field radiation pattern of the radiator. The far field radiation pattern is used as an equivalent field source in the simulation of the interaction between the antenna and the interaction structure and represents an excitation source within the interaction simulation model. The far field source is configured as a point source with its predetermined radiation pattern originating from a single, infinitesimally small source location.

The predetermined radiation pattern may be defined by electromagnetic field values on a source surface that at least partly surrounds the radiator in its far field region. The source surface may be configured as a section of a sphere or as a complete sphere. The predetermined radiation pattern may be provided numerically by specifying discrete electromagnetic field values on the source surface. The center of the source surface may coincide with the source location. The predetermined radiation pattern may also be provided analytically, e. g. by providing its expansion coefficients with respect to analytical basis functions, for example spherical modes. The spherical modes may be defined with respect to a center that coincides with the source location.

The field source is placed in an antenna plane that is oriented parallel to the source surface. The field source may be placed at the antenna surface by placing the field source in the same plane as the antenna surface so that the antenna plane and the antenna surface coincide. The field source and/or the antenna plane comprising the field source may also be placed at the antenna surface in a source distance in a forward direction in front of the antenna surface. The source distance may be at least 100 µm, at least 10 µm, or at least 1 µm. In particular, the source location of the field source may be located in the same plane as the antenna surface or within the source distance in front of the antenna surface. Within the interaction simulation model, the source location may be located near or at the center of the radiator that is represented by the field source.

The antenna model may comprise at least one additional field source representing at least one additional radiator of the antenna. In particular, the antenna model may comprise several additional field sources representing several additional radiators of the antenna. The additional field sources may be configured in the same way as it is described for the at least on field source representing the at least one radiator of the antenna. Likewise, the additional radiators may be configured in the same way as it is described for the at least one radiator of the antenna.

The antenna may comprise an electrode structure with several radiating elements. The radiating elements may be given by individual patches of a planar patch antenna or by individual slots of a planar slot antenna. Each radiator represents a subsection of the electrode structure, whereby dimensions of the subsections and the radiators are chosen so that the interaction structure is placed in the far field region of each individual radiator. Furthermore, the interaction structure may not be placed in the far field region of the entire antenna, in particular it may not be placed in the far field region of the entire set of radiating elements of the antenna, but in its near field region. In this case, it is possible to accurately represent the individual radiators by far field sources, but not the entire antenna.

The subsections of the electrode structure that are represented by the individual radiators may comprise a single radiating element or several neighboring radiating elements, for example two neighboring radiating elements or an array of neighboring radiating elements. Said subsections alternatively may comprise only a part of a single radiating element or parts of several neighboring radiating elements, such as parts of two neighboring radiating elements or parts of an array of neighboring radiating elements.

The radiating elements may be elongated in one direction or in both directions along the antenna surface. Depending on the extension of the radiating elements in a particular direction, the radiating elements may be represented by several radiators that are placed adjacent to each other in the respective direction. Each radiator may represent an electrically small part of the radiating elements or the electrode structure when compared to the distance between the antenna and the interaction structure.

In a transverse plane parallel to the front face of the antenna, the radiators may have transverse dimensions that are chosen in a way that the interaction structure is placed in the far field regions of the individual radiators, whereas the entire antenna may have transverse dimensions that place the interaction structure in the near field of the entire antenna. In the context of the present description, the far field region of a radiating structure, such as the individual radiator, is defined by a region, in which the electromagnetic field generated by said radiating structure is dominated by radiating fields, so that the electric and magnetic field components are essentially orthogonal to each other and to the propagation direction. The far field region starts at distances d from the radiating structure that are larger than $2D^2/\lambda$ with D being the maximum transverse dimension of the structure and $\lambda$ the wavelength of the emitted radiation. The region within the distance d from the radiating structure may then be denoted as near field region.

For the interaction structure being placed in the far field region of the individual radiators, the transverse dimensions D of each radiator have to be smaller than the distance between the antenna and the interaction structure, for example more than three times, more than five times, more than ten times, more than one hundred times or more than one thousand times smaller. Additionally, the distance between the radiator and the interaction structure has to be larger than the wavelength of the emitted radiation, for example more than three times, more than five times, more than ten times, more than one hundred times or more than one thousand times larger.

The antenna, in particular the part of the electrode structure comprising the radiating elements, may have transverse dimensions in the transverse plane that are comparable to or less or larger than the distance to the interaction structure. For example, the distance to the interaction structure may be less than ten times, less than five times or less than three times the transverse dimensions. In particular, the interaction structure may not be placed in the far field region of the entire antenna, but in its near field region and it may not be possible to accurately represent the entire antenna by a single far field source.

The radiation direction of the antenna may be directed into a forward open half space. The predetermined radiation pattern may at least essentially only radiate into the forward open half space. Said forward open half space is openly bounded by the antenna plane comprising the field source and extends from the antenna plane in a forward direction. The forward direction is oriented perpendicular to the antenna plane. The forward direction may be parallel to the radiation direction of the antenna. It also may have an angle with the radiation direction. The radiation field of the radiation pattern may be at least approximately equal to zero along the antenna plane. Additionally, it may be at least approximately zero in a backward open half space extending in a backward direction opposing the forward direction. This avoids any direct electromagnetic interaction between the field source and the antenna surface placed next to the field source, for example in cases, where the field source is placed in front of the antenna surface or where it is placed in the same plane as the antenna surface. At least approximately zero radiation into the backward open half space also avoids any backward radiation of the antenna model and non-physical interaction with objects behind the antenna.

The radiation pattern may be configured in a way that a power density radiated by the field source along the antenna plane and into the backward open half space is more than three times, for example more than five times, more than ten times, more than one hundred times, more than one thousand times, more than ten thousand times, more than on hundred thousand times or more than one million times smaller than the average power density radiated by the field source. The power density radiated by the field source along the antenna plane and into the backward open half space may also be zero.

The reflecting front face of the antenna comprises parts or surfaces of the antenna that reflect incoming radiation impinging onto the antenna from the forward open half space. It may comprise the electrode structure containing the radiator of the antenna. In addition, it may comprise a dielectric cover or radome of the antenna placed in front of the electrode structure. Analogously, the antenna surface of the antenna model representing the reflecting front face of the antenna in the model geometry may represent an electrode of the electrode structure of the antenna. In the case of a patch antenna, the antenna surface may at least represent the ground plane of the antenna and the dielectric material placed between the ground plane and the individual patches of the antenna. In the case of a slot antenna, the antenna surface may at least represent a metallic slotted electrode layer containing radiating slots of the antenna. In both cases, the antenna surface may additionally represent the dielectric radome of the antenna placed in front of the electrode structure, in particular including the material, for example air, in between the radome and the electrode structure. Individual or all metal layers of the electrode structure of the antenna may be modelled as lossy metals or lossy non-metal materials with predetermined loss tangents.

The antenna surface represents the reflecting front face of the antenna by being configured to model reflection of incoming radiation from the forward open half space at the individual material layers of the antenna, such as material layers of the radome and/or the electrode structure. In particular, such incoming radiation may be a part of the electromagnetic radiation launched by the field source that is scattered back towards the antenna by the interaction structure.

The interaction structure may be a vehicle structure and may include a vehicle bumper and/or a license plate and/or a head light structure and/or a support structure of the antenna and/or an ultrasonic sensor placed next to the antenna and/or the like. In general, it may be any arbitrary structure that is placed in the forward open half space in front of the antenna.

The interaction structure may at least partly surround the antenna model. The interaction structure is electrically large in comparison to the wavelength of the electromagnetic radiation emitted by the antenna. For example, a dimension of the interaction structure in at least one transverse direction, in particular in both transverse directions, may exceed ten times, one hundred times or one thousand times the wavelength of the emitted radiation.

The interaction structure may be, at least partly, electrically thin in a longitudinal direction, in which a dimension of the interaction structure is comparable to or smaller than the wavelength of the radiation. The interaction structure may be modelled as a thin sheet, for example as a multi-layered thin dielectric sheet. It may also be modelled as a complex 3D structure. Individual layers of the thin sheet may represent individual layers of the interaction structure, such as individual layers of paint applied to a bumper.

The model geometry may comprise more than one such interaction structure. The at least one electromagnetic radiator of the antenna and the field source representing the radiator in the interaction model are configured in a way that all interaction structures are placed in the far field region of the individual radiators/field sources.

The interaction of the radiation with the interaction structure that are determined by the method may comprise scattering, deflection, reflection, refraction, diffraction and/or attenuation of the radiation by the interaction structure. The method may further comprise a step of determining a part of the electromagnetic radiation that is transmitted through the interaction structure and a step of determining at least one radiation parameter of the transmitted radiation, such as an attenuation and/or a beam solid angle and/or a directivity and/or gain and/or a polarization. For example, the method may additionally or alternatively comprise determining the electric field, for example its amplitude and/or phase, and/or the magnetic field, for example its amplitude and/or phase, as the at least one radiation parameter.

The method may be used for determining the mounting position of the antenna behind the interaction structure. It may then comprise a step of varying the pose of the antenna, i.e. its position and/or orientation, in the simulation model with respect to the interaction structure and to simulate the interaction between the antenna and the interaction structure for every pose. The method may further comprise determining the at least one radiation parameter of the transmitted radiation for every pose and to determine an optimum pose, in which the transmitted radiation satisfies a pre-described design goal, such as not exceeding a maximum distortion limit or radar performance degradation limit. The method may further comprise mounting the physical antenna with respect to the interaction structure in the optimum pose determined from the simulation, for example at a vehicle.

The radiation emitted by the field source may, for example, be propagated in the radiation direction using an asymptotic numerical method based on geometrical optics. The step of determining electromagnetic radiation launched by the field source based on the predetermined radiation pattern may comprise: determining electromagnetic rays that are launched by the field source based on the predetermined radiation pattern. The step of propagating the radiation in the radiation direction using an asymptotic numerical method may comprise: tracing the rays using geometrical optics. The predetermined radiation pattern of the field source may define the directions and/or the number and/or the intensity of rays emerging from the field source. The rays may be traced in the full three-dimensional space surrounding the antenna model.

For example, the asymptotic numerical method used for propagating the rays and determining the interaction between the electromagnetic radiation and the interaction structure may be the "shooting and bouncing rays" (SBR) method. In this method, the radiation incident on the scattering object is represented by rays that are traced using geometrical optics and the interaction of the individual rays with surfaces, for example with the scattering structure or the antenna, is determined using physical optics by performing an integration covering the intersection of the individual rays with the surface.

In the context of the present description, a full wave method is a numerical method that solves the full set of Maxwell's equations without approximating or neglecting any field components. In the context of the present description, an asymptotic numerical method may be understood as a numerical method that describes electromagnetic radiation in terms of rays or ray fields and approximates the interaction of the radiation with electrically large structures by reflection, diffraction and the like. Such asymptotic numerical methods are, for example, described in Chou HT, Lee TH: Asymptotic High Frequency Methods, in: Novel Technologies for Microwave and Millimeter—Wave Applications, Springer, Boston, Mass., 2004. Besides SBR, asymptotic methods that may be used within the computer implemented steps of the method described herein comprise ray launching (RL), geometrical optics (GO), ray launching geometrical optics (RL-GO), physical optics (PO), geometrical theory of diffraction (GTD) or physical theory of diffraction (PTD). A combination of ray launching and geometrical optics is, for example, described in Lacik et al.:

On Using Ray-Launching Method for Modeling Rotational Spectrometer, Radioengineering, Vol. 17, Nr. 2, 2008, p. 98 ff., published by Brno University of Technology, Brno, ISSN 1805-9600.

For example, the asymptotic numerical method used to propagate the radiation emitted by the field source may be RL-GO as implemented in the commercially available simulation software FEKO 2018 offered by Altair Engineering, Inc.

In the context of the present description, the term "electrically large" generally refers to dimensions that are larger than the wavelength of the simulated electromagnetic radiation. For example, the dimensions may be more than two times, more than three times, more than five times, more than ten times, more than one hundred times or more than one thousand times larger than said wavelength. The terms "electrically small" and "electrically thin" generally refer to dimensions that are smaller than the wavelength of the simulated electromagnetic radiation. For example, said dimensions may be more than two times, more than three times, more than five times, more than ten times or more than one hundred times smaller than said wavelength.

According to an embodiment, the antenna surface comprises an opening, whereby the field source is placed inside the opening. For example, the field source may be placed inside the opening in a plane defined by the antenna surface. By providing a predetermined radiation pattern with zero field components along the antenna surface and by placing the field source inside the opening of the antenna surface, electromagnetic interaction between the field source and the antenna surface may be suppressed or avoided. At the same time, the simulation still accounts for reflections at the antenna surface if electromagnetic radiation is scattered back towards the antenna surface. Placing the field source in the same plane as the antenna surface also has the effect that only the edge of the (two-dimensional) antenna surface faces towards the field source and thus is exposed to the field source. This also avoids the field source directly interacting with the antenna surface.

Also, using of the opening concept in combination with a thin dielectric sheet concept (described below) enables at the same time, to consider the radome for the reflectivity of the antenna and to avoid geometrical placement of the radome in front of the radiation sources. The impact of the radome on the electromagnetic radiation launched by the field sources can be represented by the predetermined radiation pattern of the individual sources. A distance from the edges of the opening to the nearest field source placed within the opening may correspond to a minimum possible distance between field sources and elements of the model geometry that is compatible with the asymptotic numerical method used for simulation.

According to an embodiment, the radiation pattern is continuous in a volume surrounding the field source. This ensures that the predetermined radiation pattern accurately represents the electromagnetic field radiated by the radiator represented by the field source.

According to an embodiment, the antenna surface has a reflectivity that is smaller than 100%. The antenna surface may, for example, comprise a metal with finite conductivity or a lossy non-metal material or a high permittivity and/or high permeability dielectric material. For example, the modelled antenna surface may comprise a layer having finite conductivity, such as a layer comprising a lossy metal or a lossy or a high permittivity or high permeability non-metal material or consisting of a lossy metal or a lossy or a high permittivity and or high permeability non-metal material. This layer may, for example, represent a ground plane or a slotted electrode of the electrode structure of the antenna. Although it might be more obvious to model such a layer as a perfect electric conductor, it has been found that a layer with a reflectivity lower than that of perfect electric conductor more accurately reproduces the scattering properties of the front face of a planar antenna, such as the front face of a planar slotted waveguide antenna or the front face of other planar antenna types, as well as the front face of automotive radar sensor or product.

According to an embodiment, the antenna surface has a multilayered dielectric material, for example a first layer comprising a reflective material with a reflectivity smaller than 100%, such as a lossy metal or a reflective non-metal material, and/or a second layer comprising air and/or a third layer comprising a dielectric material. The individual layers of the antenna surface may represent individual layers of an antenna comprising an electrode structure and a dielectric cover or radome placed in front of the electrode structure. The dimensions, especially the thickness of the individual layers along the forward direction, and the electromagnetic properties of the individual layers may be adapted to represent the electromagnetic properties of the entire antenna including the electrode structure with the radiator and the dielectric radome.

The first layer may be configured as lossy metal or reflective non-metal and may represent a conducting layer of the electrode structure, for example the slotted electrode of a slotted waveguide antenna or the ground plane of a planar patch antenna, the second layer may be configured as air and may represent the hollow space between the electrode structure and the cover or radome, while the third layer may be configured as dielectric material and may represent the radome. By configuring the first layer as lossy metal or reflective non-metal, this layer additionally accounts for the energy absorbed by the antenna. In case of a planar patch antenna, the multilayered dielectric material may comprise a fourth dielectric layer that is placed between the first and the second layer and represents a dielectric substrate placed between the ground plane and the radiating patches. Arbitrary additional layers can be added to achieve required accuracy of the reflection properties According to an embodiment, the antenna surface is configured as an infinitesimally thin two-dimensional sheet. This thin sheet represents the entire front face of the antenna in the model geometry and has predefined electromagnetic parameters assigned to it, such as impedance, resistance, permittivity and/or permeability, loss tangent or the like. When modelling electromagnetic interactions with such a thin sheet, the interacting electromagnetic fields may be represented, for example using physical optics methods, by equivalent surface integrals of surface currents and surface charges along the sheet, whereby the surface currents and charges represent the tangential and/or normal electromagnetic field components of the interacting field.

The interaction of the electromagnetic radiation with the antenna front face may be represented in the simulation model by a two-dimensional boundary condition applied to the antenna surface. This boundary condition may approximate, in particular, a reflection of the electromagnetic radiation by the antenna front face. Such a two-dimensional boundary condition may be, for example, defined by a thin dielectric sheet (TDS) boundary model, in particular a multilayered thin dielectric sheet boundary model, or a surface impedance boundary model.

According to an embodiment, the method comprises:
- obtaining reference reflectivity values of the front face of the antenna or radar sensor, for example by performing a measurement of electromagnetic reflection of the front face or by performing a full wave simulation of electromagnetic reflection by the front face;
- obtaining simulated reflectivity values by simulating, with the processing unit of the computer, electromagnetic reflection off the antenna surface of the antenna model using the asymptotic numerical method; and
- adapting electromagnetic parameters of the antenna surface of the antenna model to reproduce the reference reflectivity values of the front face of the antenna by the simulated reflectivity values.

By adapting the electromagnetic parameters of the antenna surface to reproduce the measured reflectivity values, it is possible to provide an antenna surface that accurately represents the electromagnetic properties, in particular the reflectivity, of the front face of the simulated antenna or radar sensor. The front face of the antenna, the reflectivity of which is represented by the antenna surface, may comprise the electrode structure of the antenna as well as the radome or cover of the antenna placed in front of the electrode structure The electromagnetic parameters that are adapted may, for example, include values for an impedance and/or a resistance and/or a dielectric constant and/or a loss tangent and/or a thickness of the individual layers represented by the antenna surface and/or a number of said layers, or the like.

The reference reflectivity values may be obtained by performing the simulation on a further processing unit of a further computer, wherein the further computer and the further processing unit may be the same as or different from the computer and processing unit for simulating the interaction between the antenna and the interaction structure using the antenna model and the asymptotic numerical method. The adapted electromagnetic parameters of the antenna surface are stored in the antenna model provided in the memory unit of the computer used for simulating the interaction between the antenna and the interaction structure using the antenna model and the asymptotic numerical method.

According to an embodiment, the antenna comprises an electrode structure having several radiating elements and the interaction structure is positioned in the near field region of the entire electrode structure. Furthermore, the antenna model comprises a plurality of far field sources, each far field source representing one of a plurality of individual radiators, wherein the plurality of radiators comprises the at least one radiator. Each radiator represents a part of the electrode structure that has dimensions that place the interaction structure in the far field region of the radiator, and each far field source is defined by a predetermined radiation pattern with a radiation field directed towards the antenna surface at least approximately being equal to zero so that direct electromagnetic interaction between the field sources and the antenna surface is avoided.

By defining the individual radiators, in particular by choosing the transverse dimensions of the individual radiators, in a way that the interaction structure is placed in the far field region of each radiator, at least the individual radiators may be accurately replaced by far field sources in the simulation model. The individual radiators and the associated field sources may be commonly placed in the antenna plane. Each far field source represents one of the individual radiators and each radiator is represented by one of the far field sources.

The individual radiation patterns may be configured in a way that direct electromagnetic interaction between the field sources and the antenna surface is avoided by providing the individual predetermined radiation patterns in a way that radiation fields of the radiation patterns that are directed towards the antenna surface in each case at least approximately equal zero. For example, radiation fields of the radiation patterns that are directed towards or along the antenna surface may in each case be equal to zero or at least essentially equal to zero.

Like with the at least one radiator, the radiation fields that are directed towards the antenna surface being at least approximately equal to zero in each case means that a power density of the predetermined radiation pattern that is radiated towards the antenna surface is more than three times, for example more than five times, more than ten times, more than one hundred times, more than one thousand times, more than ten thousand times, more than one hundred thousand times or more than one million times, smaller than the average power density radiated by the individual field sources. The power density of the predetermined radiation patterns of the individual field sources that is radiated towards the antenna surface may also be zero.

According to an embodiment, the method comprises:
- providing, in memory of a computer, a source model comprising a source element that represents the radiator and a material layer that is placed at the source element and extends parallel to the antenna surface;
- simulating, by a processing unit of the computer, an electromagnetic radiation field radiated into full space using the source model; and
- extracting, by the processing unit of the computer, far field components of the radiation field as the predetermined radiation pattern in at least a forward open half space bounded by an antenna plane that is parallel to the antenna surface.

Providing a material layer that is placed parallel to the antenna plane ensures that the electromagnetic field values of the radiation field radiated that are directed towards the antenna plane are at least approximately equal to zero. Therefore, the predetermined radiation pattern that is determined from the source model comprises at least essentially zero radiation components along the antenna plane. In addition, radiation components in a backward half space bounded by the antenna plane and opposing the forward half space are also at least essentially zero or may be omitted from the predetermined radiation pattern without introducing discontinuities into the radiation pattern. The antenna plane may coincide with the antenna surface or it may be placed in the forward direction in front of the antenna surface. As a result, the predetermined radiation pattern yields a field source with a radiation pattern that is essentially not directed towards the antenna surface so that the radiation field of the radiation pattern that is directed towards the antenna surface at least essentially equals zero. As a consequence, direct electromagnetic interaction between the field source and the antenna surface is avoided in the antenna model used for subsequent propagation with an asymptotic numerical method.

Parameters of the material layer, such as electromagnetic parameters, for example a dielectric constant, a loss tangent, a layer thickness, a number of layers, or the like, and/or mechanical parameters, for example a layer distance to the antenna plane, a layer thickness perpendicular to the antenna plane or the like, are configured in a way that the radiation field of the extracted predetermined radiation pattern has the properties mentioned throughout this description. In particular, the parameters are adapted in a way that the radiation field of the extracted predetermined radiation pattern that is directed towards and/or along the antenna plane is equal to zero or at least approximately equal to zero. Additionally, the parameters may be adapted so that the radiation field of the extracted predetermined radiation pattern that is directed into the backward open half space bounded by the antenna plane is equal to zero or at least approximately equal to zero. For example, the electromagnetic parameters of the material layer may be adapted in a way that the extracted predetermined radiation pattern essentially does not radiate along the antenna plane and/or into the backward open half space bounded by the antenna plane.

The predetermined radiation pattern may be extracted from the far field components of the radiation field in the full space enclosing the source element. Alternatively, the predetermined radiation pattern may only be extracted from the forward open half space bounded by the antenna plane or from a forward closed half space comprising the antenna plane. The remaining part of the predetermined radiation pattern, for example the part of the predetermined radiation pattern in the backward open half space, then may be set to zero.

The radiation field of the source model may be simulated on a further processing unit of a further computer, wherein the further computer and the further processing unit may be the same as or different from the computer and processing unit for simulating the interaction between the antenna and the interaction structure using the antenna model and the asymptotic numerical method. The predetermined radiation pattern is stored in the antenna model provided in the memory unit of the computer used for simulating the interaction between the antenna and the interaction structure using the antenna model and the asymptotic numerical method.

The simulation of the radiation field of the source model may be performed using any suitable simulation method, for example a full wave simulation method, asymptotic methods or a boundary element method or method of moments etc. The predetermined radiation pattern extracted from the source model provides for an adjusted field source that accurately reproduces the actual radiation pattern of the individual radiator that it represents, including all effects caused by placing said radiator inside the antenna and the radar sensor.

The source element may be configured as an elongated source element that is elongated in one or both transverse directions along the antenna surface. The source element may comprise an equivalent source representing the radiator, such as a far field source, an aperture field source, a surface current source or the like. If the antenna is configured as a slot antenna, the source element may be given as an aperture field inside a slot or inside a pair of neighboring slots of the antenna or inside a longitudinal section of a slot or a pair of slots. The equivalent source may be determined from a simulation of the subsection of the electrode structure that is represented by the radiator, for example from a full wave simulation. It may also be determined analytically, for example in the case of a field of an aperture or a surface patch. Alternatively, the source element may also be given by direct source terms, such as source voltages or source currents, applied to individual conductors of the electrode structure of the antenna that are included in the source model and the field of the source element may be directly determined in the source model, for example by solving the source model using a full wave solver.

If the simulation model contains several radiators, each of which represents a subsection of the electrode structure of the antenna, the steps of providing a source model, simulating an electromagnetic radiation field using the source model and extracting far field components of the radiation field as predetermined radiation patterns of individual field sources are individually performed for each radiator. This allows for extracting separate predetermined radiation patterns for each individual radiator and for building an adjusted far field source for each individual radiator. Additionally, a source element may be constructed for each radiator and used within the source model of the respective radiator.

The material layer may have a constant thickness perpendicular to the antenna plane and may extend infinitely in the transverse plane parallel to the antenna plane. The material layer may be placed at a layer distance from the antenna plane. The layer distance may be smaller than the wavelength of the radiation emitted by the source element, for example more than ten times, more than one hundred times or more than one thousand times smaller.

According to an embodiment, the antenna is configured as a slot antenna and the source element defines an aperture field inside a slot of the antenna. Such a source element may be configured as an elongated source element. It may be provided by an aperture field, surface current distribution or the like.

According to an embodiment, the material layer comprises a dielectric and/or an absorbing material that is specified by its relative permittivity and/or loss tangent. The material layer may be a dielectric layer or an absorbing dielectric layer with a non-zero loss tangent. The material parameters of the material layer do not have to correspond to a real physical material.

If the antenna model comprises several far field sources each of which represents a radiator of the antenna, the material layers used to define the predetermined radiation pattern by solving the source model may be equal within all source models. In particular, the material parameters of the individual material layers may be equal for all source models.

According to an embodiment, the material layer has a finite thickness in a direction perpendicular to the antenna plane and is placed in front of the source element inside the forward open half space bounded by the antenna plane. The forward open half space extends from the antenna plane in the forward direction and does not contain the antenna plane itself. The material layer in front of the source element may comprise a dielectric material or it may consist of a dielectric material. Said dielectric material may have a predetermined dielectric constant and/or loss tangent.

According to another embodiment, the material layer is placed behind the source element inside the backward open half space that is bounded by the antenna plane and opposes the forward open half space. The material layer that is placed behind the source element may comprise an absorbing material or it may consist of an absorbing material. A material layer comprising an absorbing material effectively suppresses any backward radiation inside the backward open half space of the source model, and at the same time cancels any radiation field radiated along the antenna surface.

The material layer that is placed behind the source element may have an infinite thickness in the backward direction perpendicular to the antenna plane and therefore may fill the backward open half space. It may also have a finite thickness in the direction perpendicular to the antenna plane. It may additionally be backed by an electric conductor in the direction perpendicular to the antenna plane. The electric conductor may have perfect electric conductivity or it may have finite electric conductivity. The electric conductor may be placed on a back surface of the material layer that opposes a front surface of the material layer that is located next to the source element. Such an electric conductor may cancel any backward radiation in addition to the absorbing material of the material layer.

According to an embodiment, the method comprises:
determining, with the processing unit of the computer, a reference radiation pattern radiated by the radiator of the antenna comprising the radiator; and
adapting electromagnetic parameters of the material layer, such as a dielectric constant, a loss tangent, a layer thickness, a number of layers, or the like, to reproduce the reference radiation pattern by the simulated electromagnetic radiation field radiated by the source model.

The reference radiation pattern may be determined by measuring a radiation pattern radiated by the radiator of the antenna or by the entire electrode structure of the antenna or the full radar sensor containing the full antenna, radome and arbitrary structures e. g. between them. The reference radiation pattern may alternatively be determined by simulating the radiation pattern radiated by the radiator of the antenna or by the entire electrode structure, or by entire antenna or radar sensor, for example by using a full wave simulation method. The radiation pattern radiated by the radiator or the electrode structure may be measured or simulated without the interaction structure. The radiation pattern radiated by the radiator or the electrode structure may be measured or simulated with or without the radome of the antenna placed in front of the antenna.

If the electrode structure of the antenna comprises several subsections, each of which is represented by a separate radiator, the reference radiation pattern may comprise all radiation fields of the individual radiators as a superposition. Additionally, the step of adapting electromagnetic parameters may be performed for each material layer of the source models of the individual radiators. The reference radiation pattern may then be compared to a superposition of all predetermined radiation patterns extracted from the individual source models.

According to an embodiment, the method comprises a step of determining interactions of the radiation with additional interaction structures that are directly and/or indirectly irradiated by the radiation launched by the field source and by radiation launched by additional field sources, wherein the additional interaction structures are located in a forward direction from the antenna surface and/or in a backward direction from the antenna surface and/or to the side of the field source.

The additional interaction structures may be arbitrarily shaped. They may be directly irradiated by the radiation launched by the field sources without prior interaction of the radiation with other structures of the model geometry or they may be indirectly irradiated by portions of the radiation launched by the field sources that have been redirected by the interaction structure and/or one or several of the additional interaction structures, for example by reflection, diffraction or the like. The field source and the additional field sources may all be placed in the antenna plane. The additional interaction structures may be, for example, located in the forward half space and/or in the backward half space bounded by the antenna plane.

The method may also comprise a step of determining interactions of the radiation with one additional interaction structure that is directly or indirectly irradiated by the radiation launched by the field source or by the field source and the additional field sources, wherein the additional interaction structure may be located in a forward direction from the antenna surface and/or in a backward direction from the antenna surface and/or to the side of the field source or the field source and the additional field sources within the antenna surface. When being located in the forward direction and in the backward direction, the additional interaction structure extends both in the forward and in the backward direction.

In another aspect, the present disclosure is directed at a computer system, said computer system being configured to carry out several or all steps of the method described herein.

The computer system comprises the processing unit, at least one memory unit and at least one non-transitory data storage. The non-transitory data storage and/or the memory unit may comprise a computer program for instructing the computer to perform several or all steps or aspects of the method described herein.

In another aspect, the present disclosure is directed a computer program for instructing a computer to perform several or all steps or aspects of the method described herein.

The present disclosure is also directed at a non-transitory computer readable medium comprising instructions for carrying out several or all steps or aspects of the method described herein. The computer readable medium may be configured as: an optical medium, such as a compact disc (CD) or a digital versatile disk (DVD); a magnetic medium, such as a hard disk drive (HDD); a solid state drive (SSD); a read only memory (ROM), such as a flash memory; or the like. Furthermore, the computer readable medium may be configured as a data storage that is accessible via a data connection, such as an internet connection. The computer readable medium may, for example, be an online data repository or a cloud storage.

DRAWINGS

Figure 2:
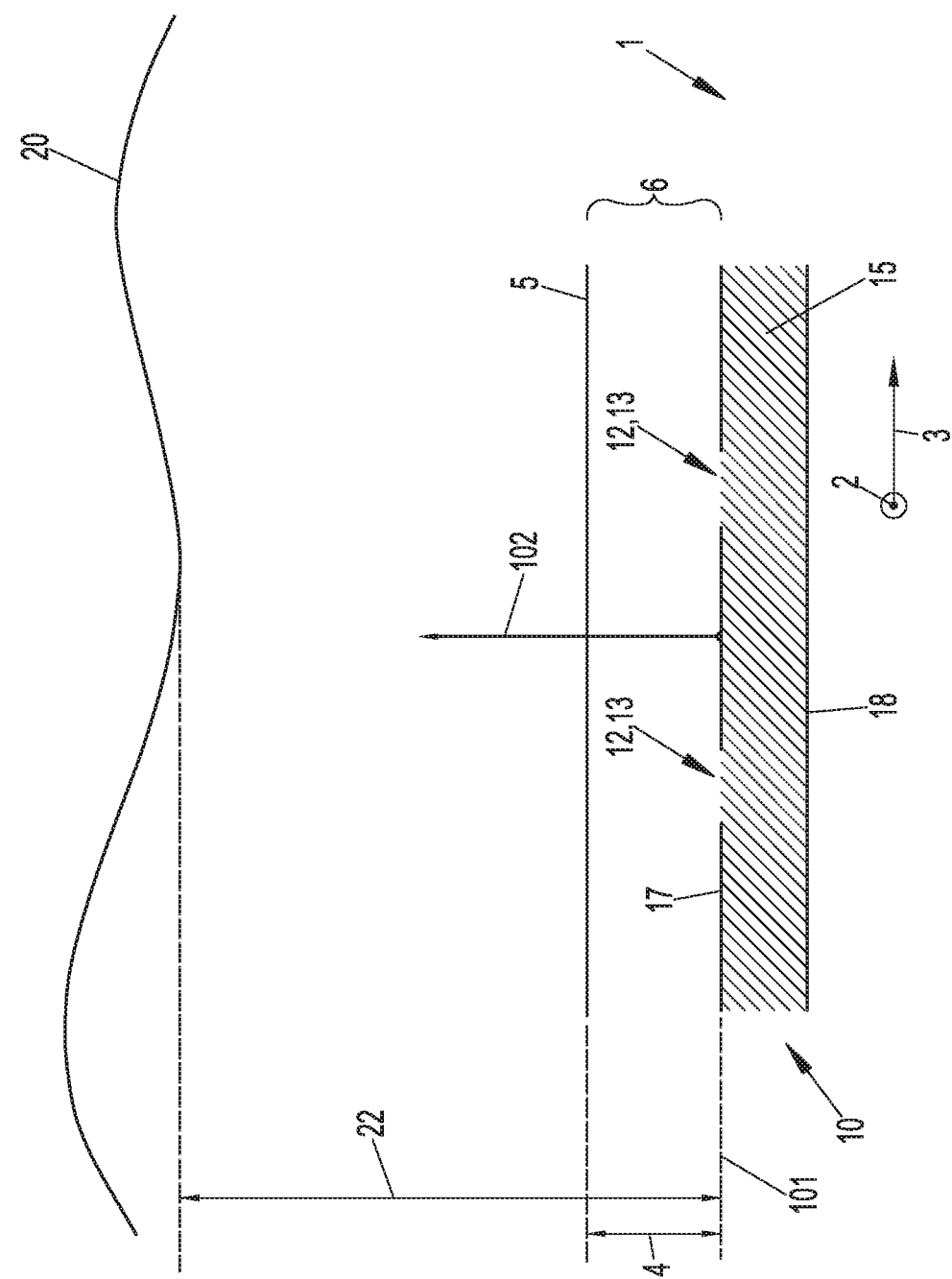
Figure 3:
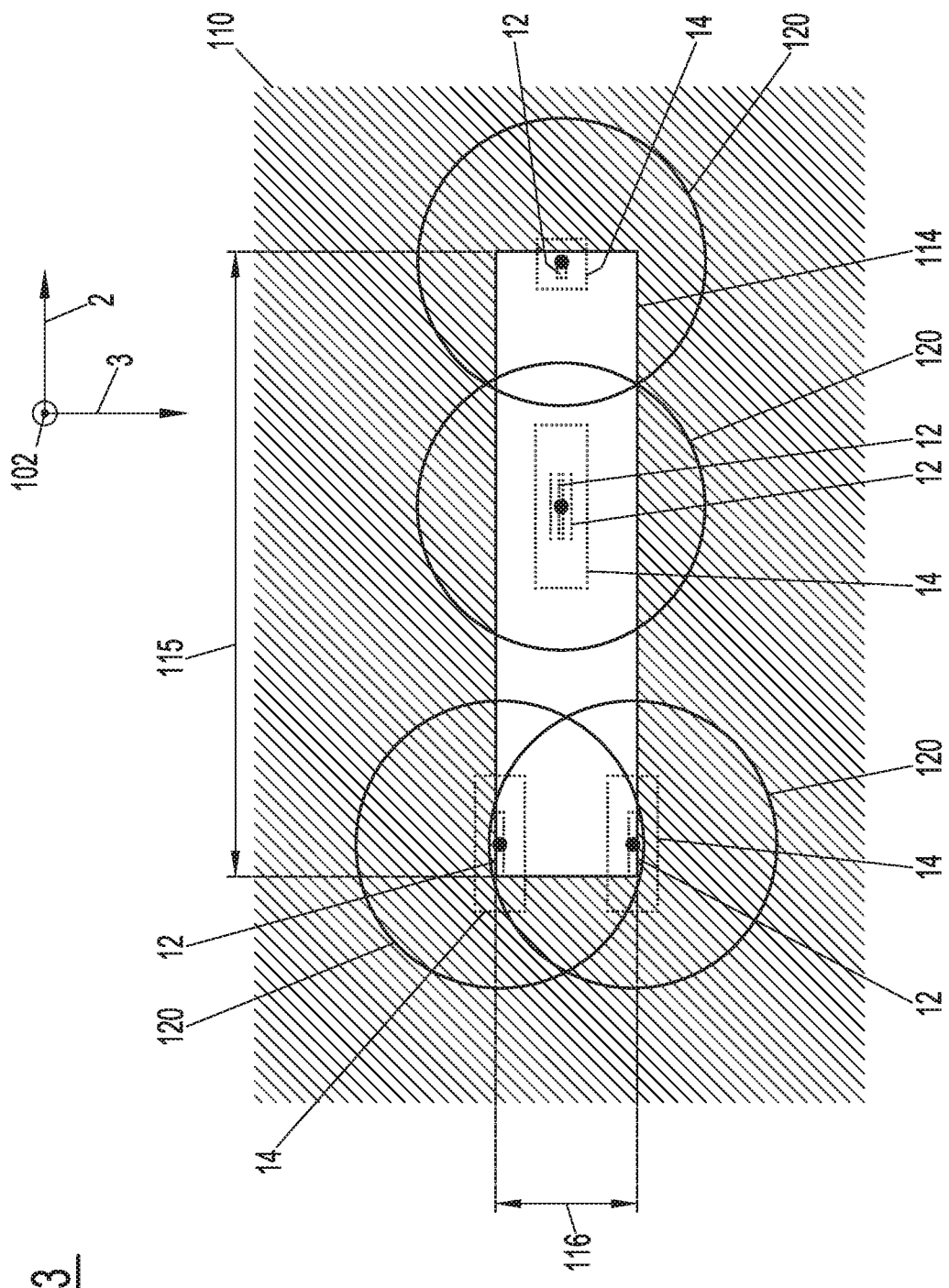
Figure 4:
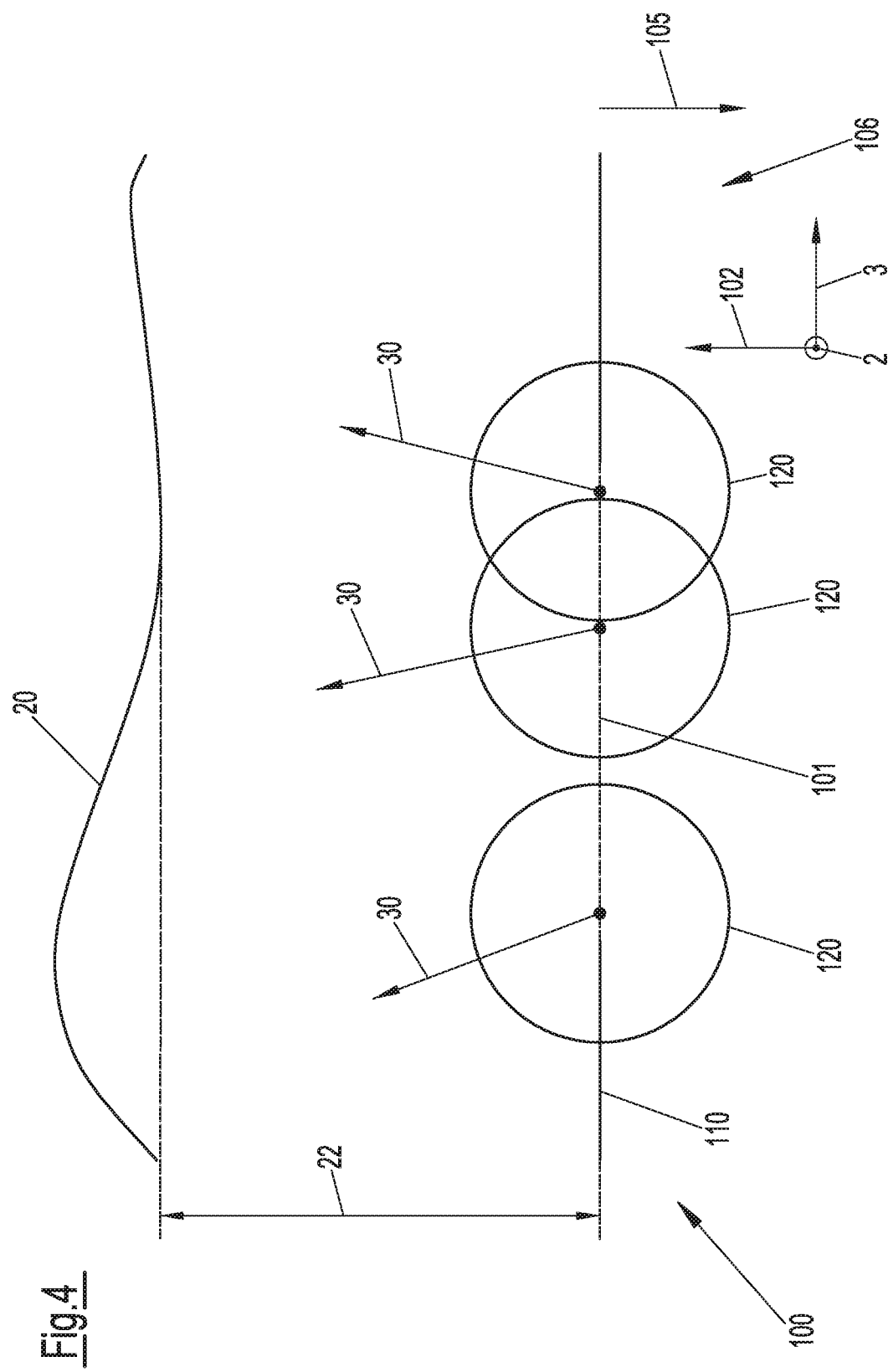
Figure 5:
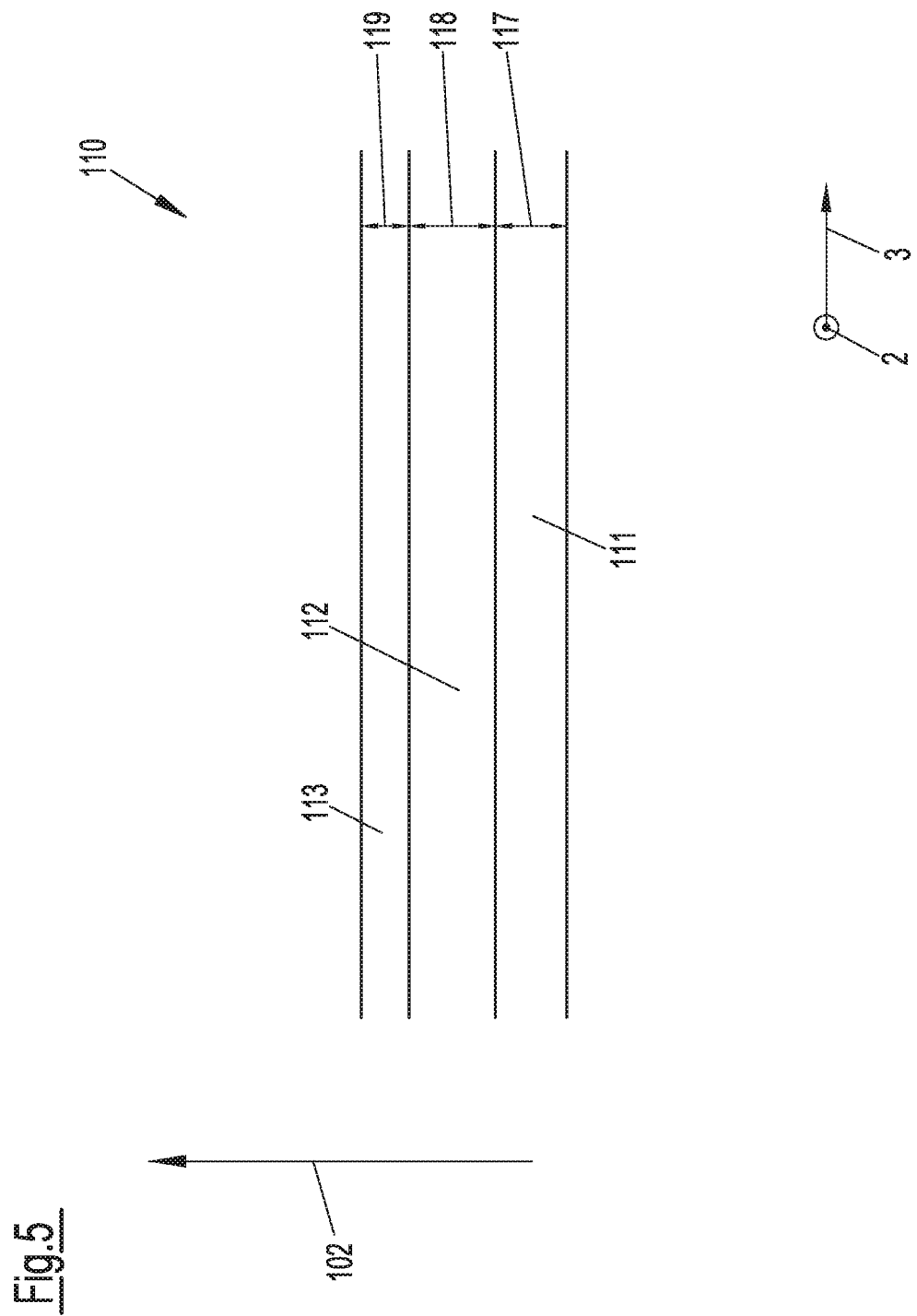
Figure 6:
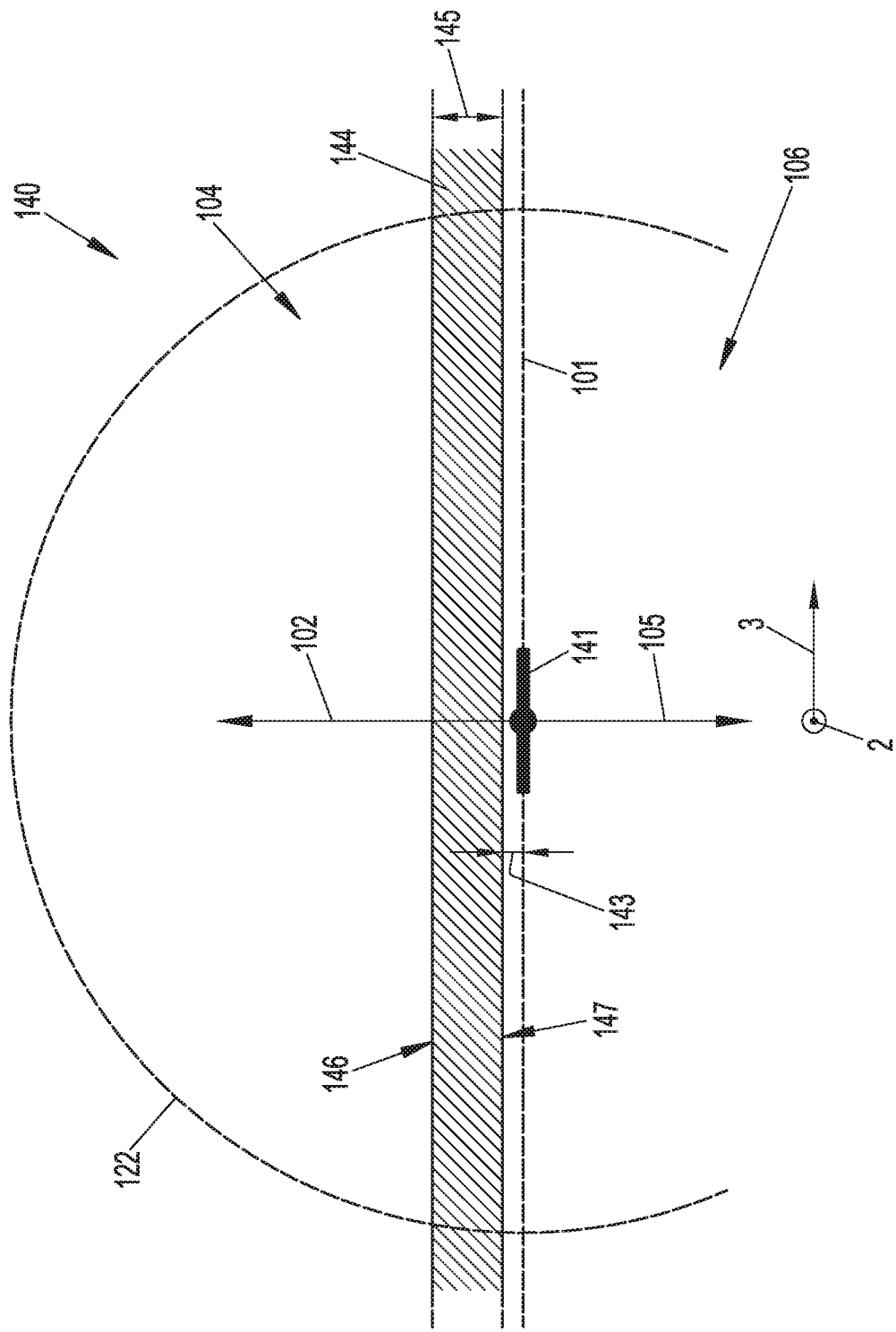
Figure 7:
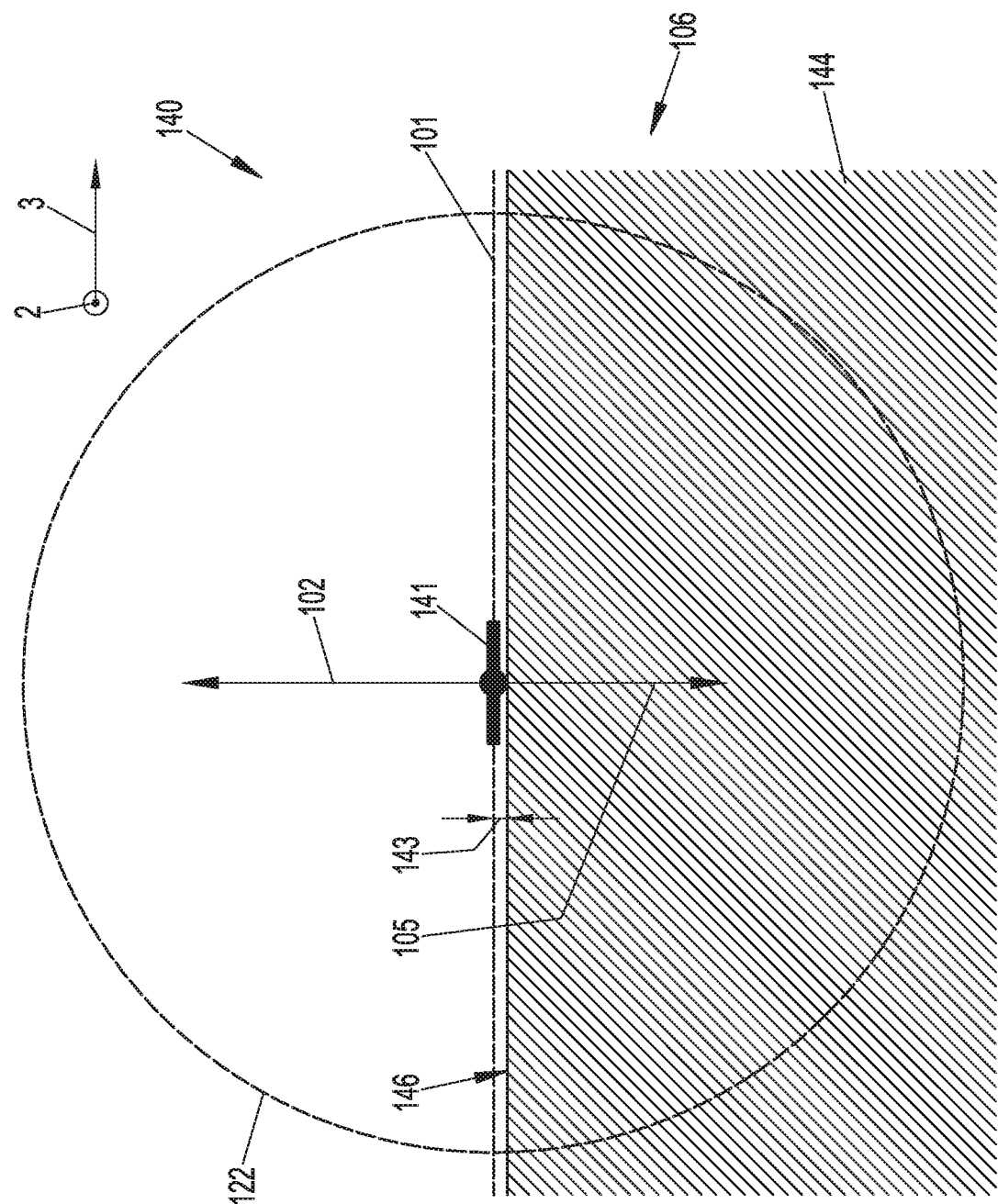
Figure 8:
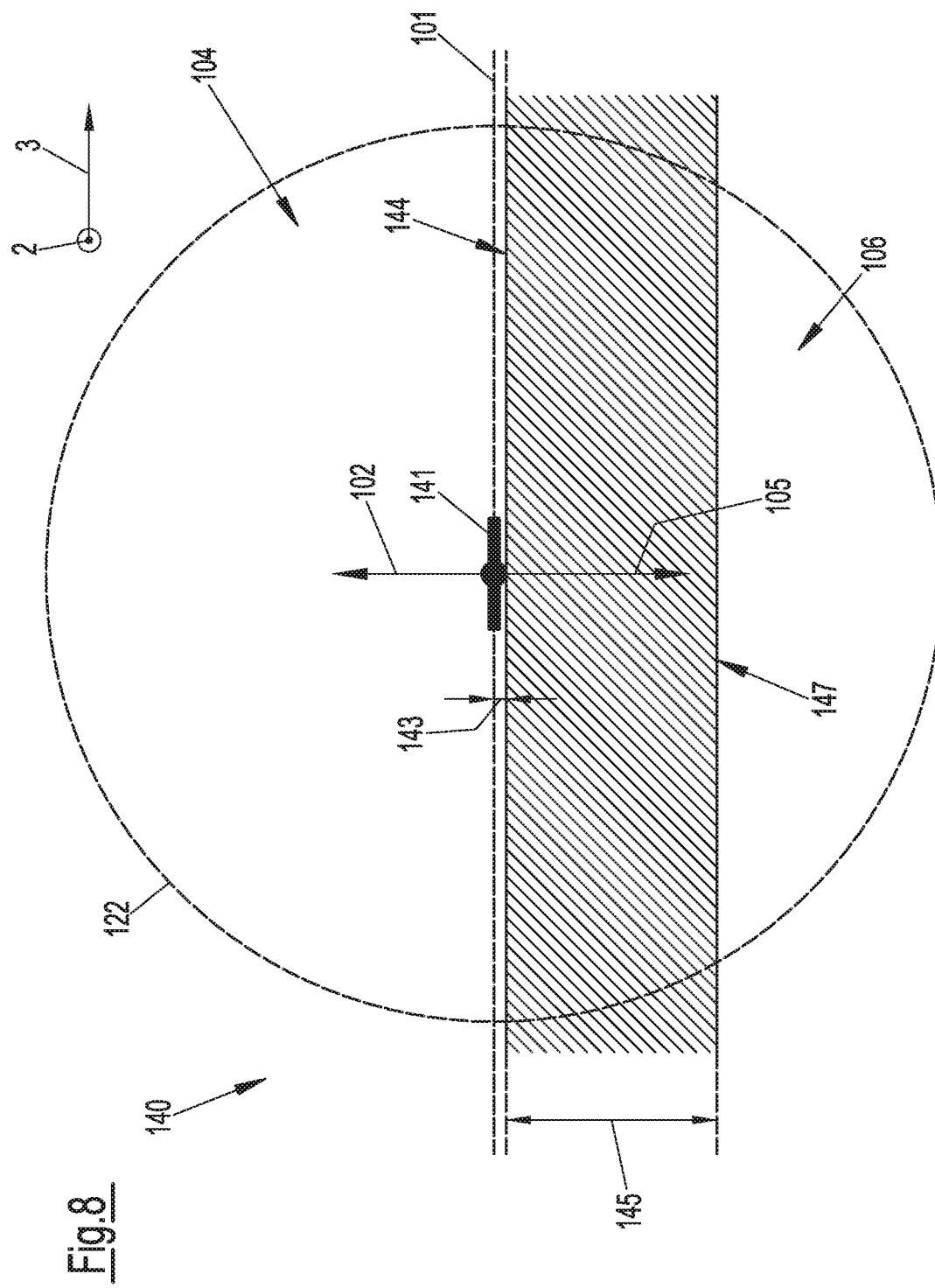
Figure 9:
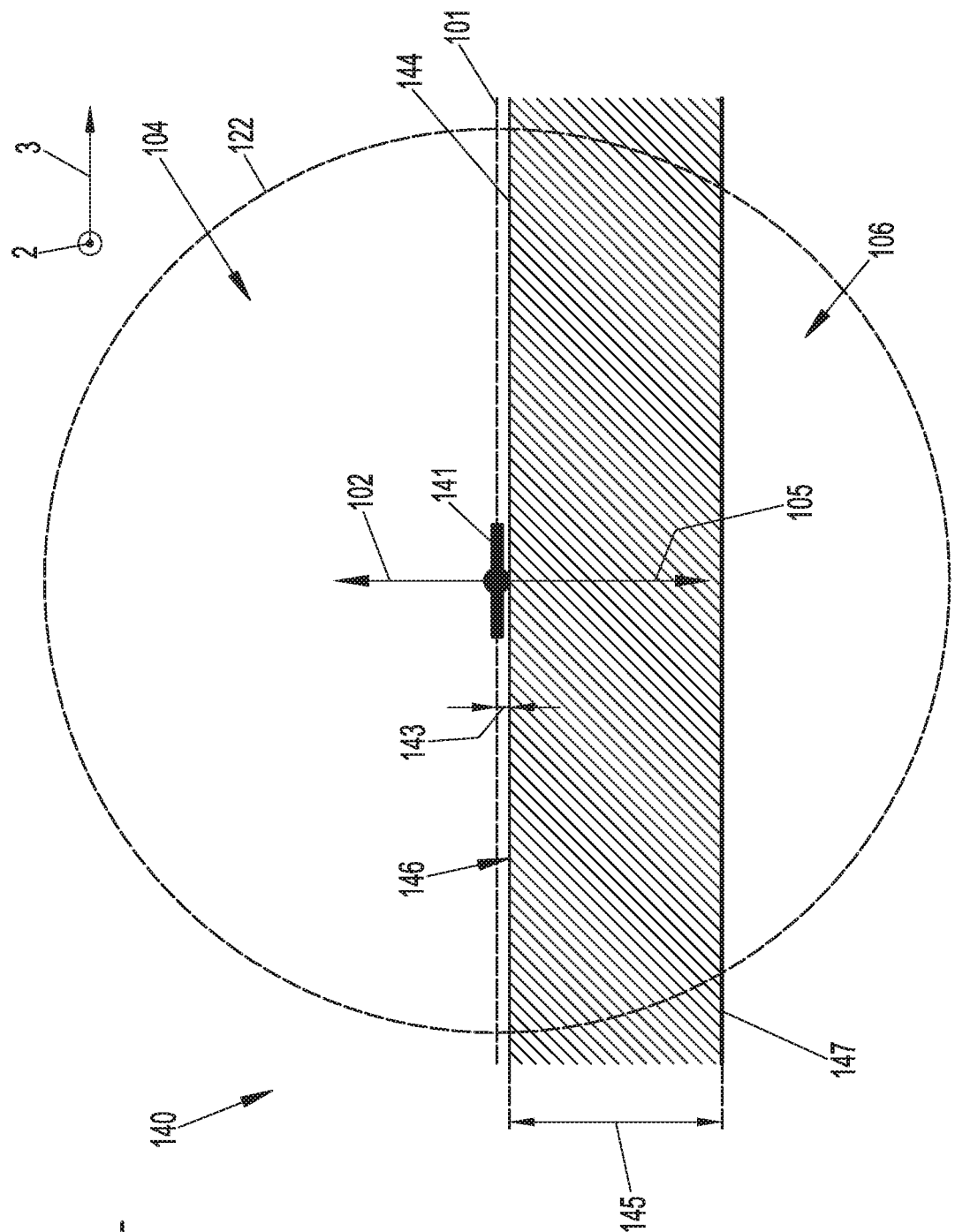
Figure 10:
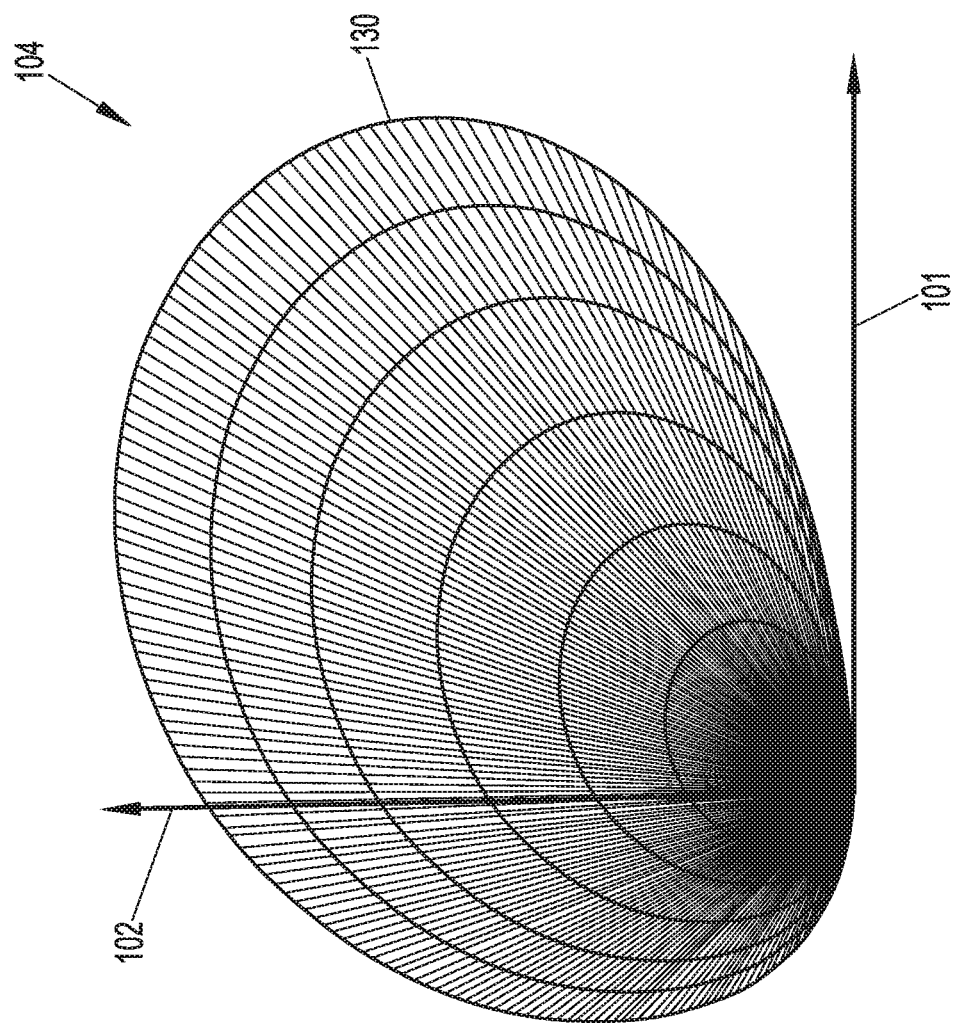
Figure 11:
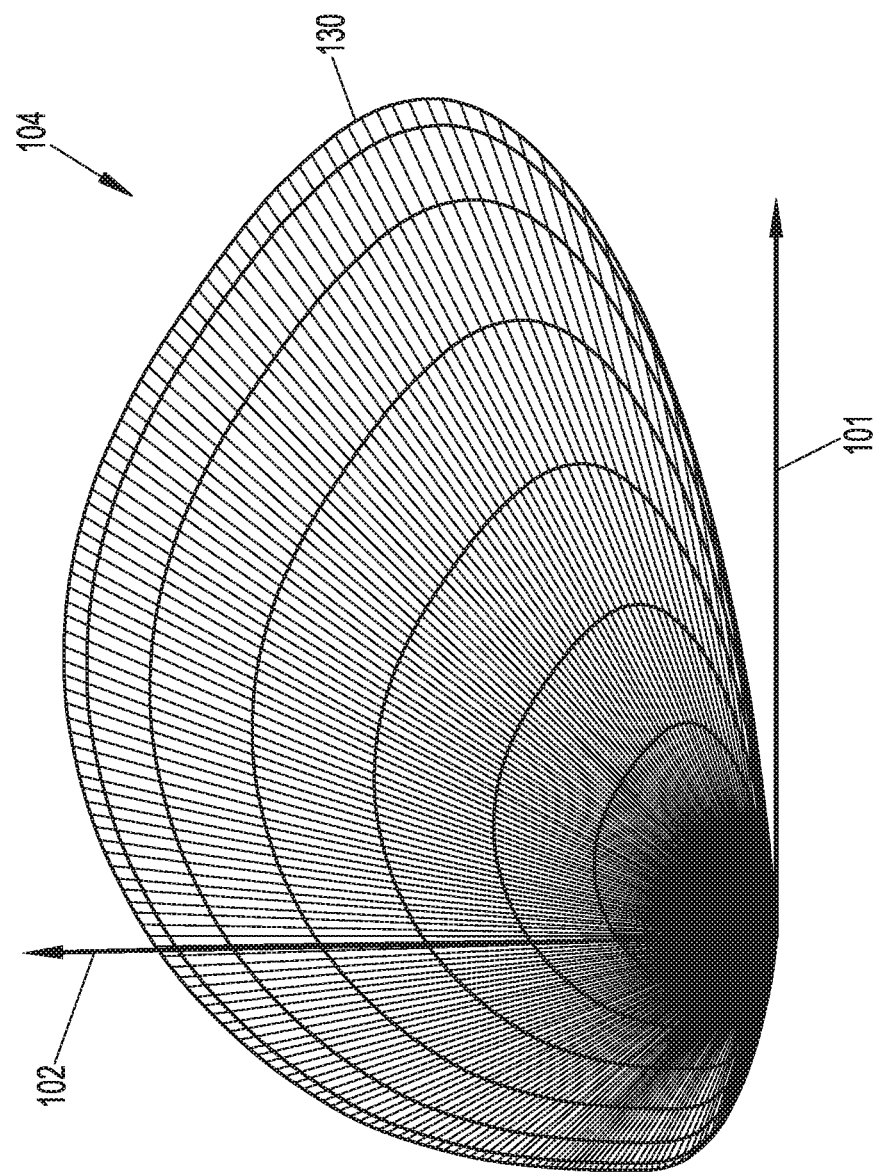
Figure 12:
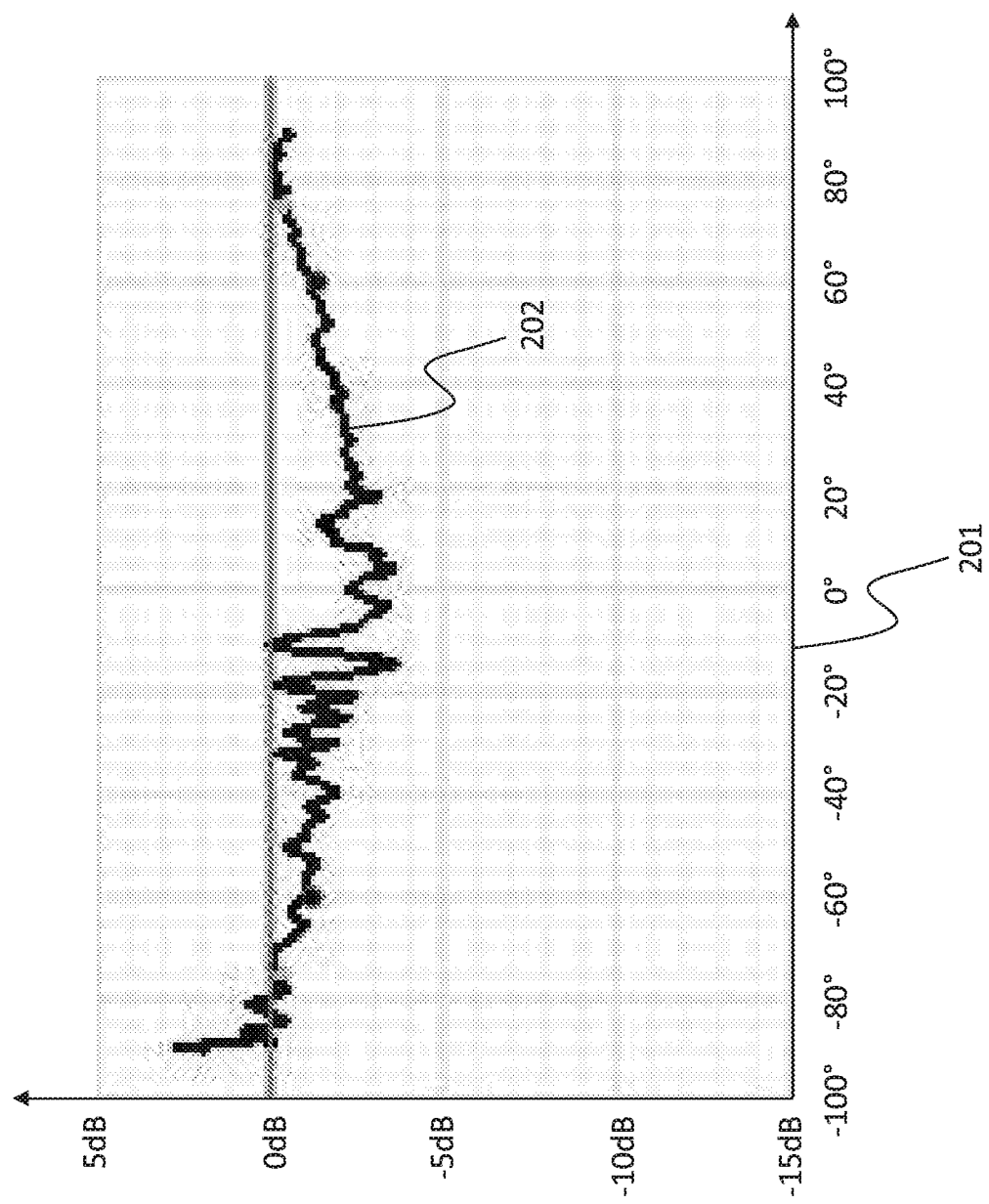
Figure 13:
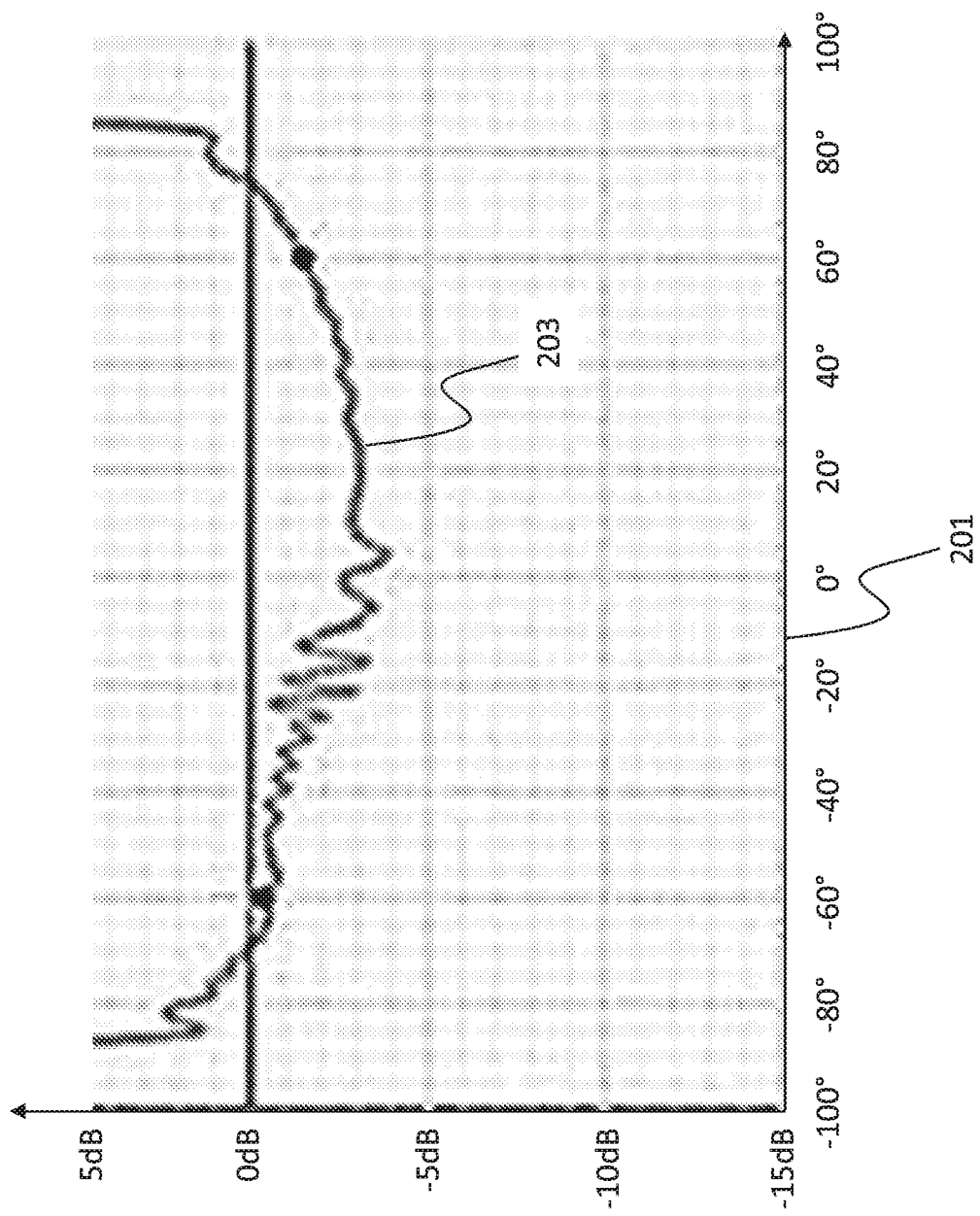
Figure 14:
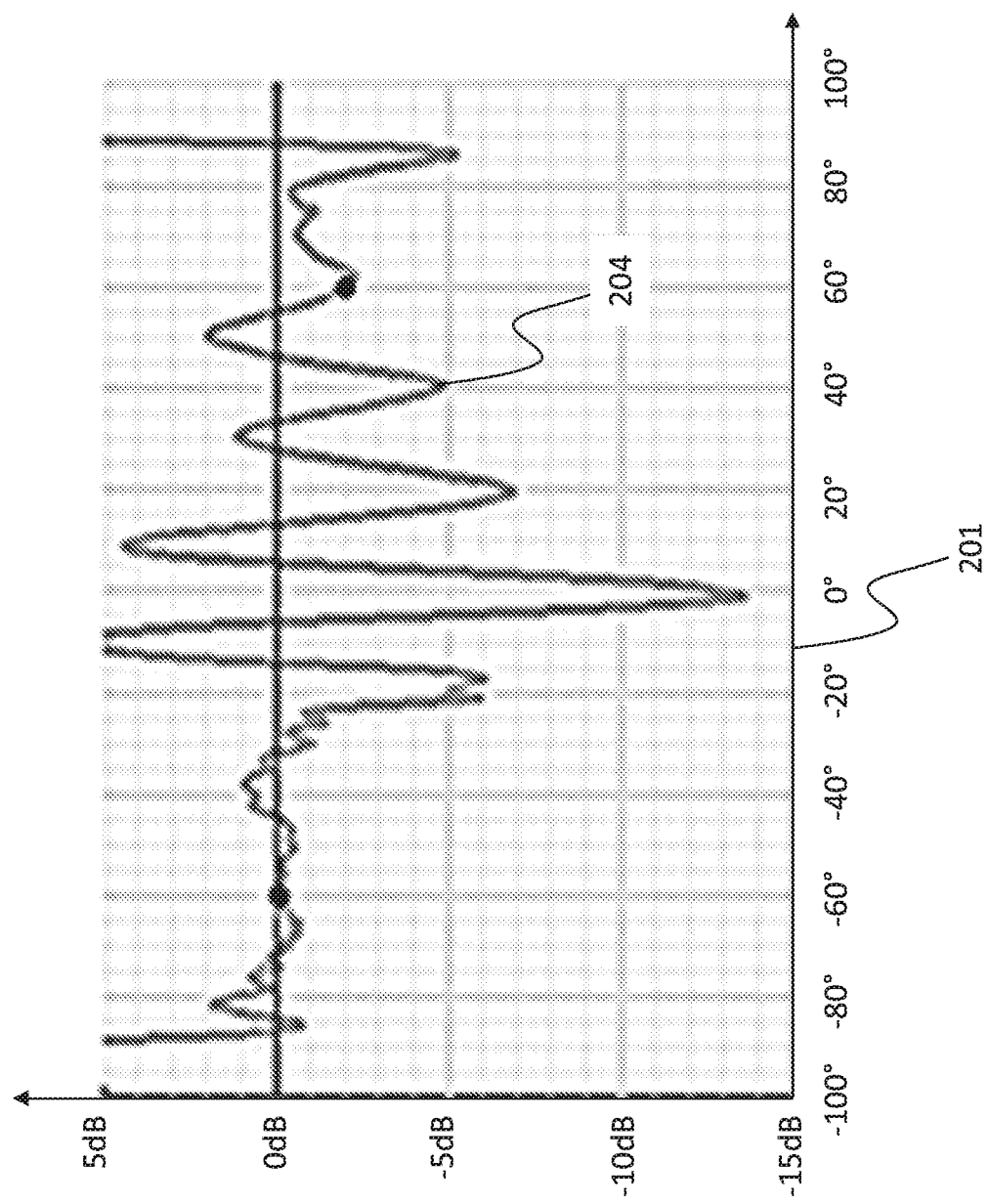

Exemplary embodiments and functions of the present disclosure are described herein in conjunction with the following drawings, showing schematically:

FIG. 1 a front view of an antenna configured as a planar slot antenna;

FIG. 2 a sectional side view of the antenna with an interaction structure placed in front of the antenna;

FIG. 3 a front view of an antenna model representing the radar antenna;

FIG. 4 a sectional side view of an interaction simulation model comprising the antenna model and the interaction structure;

FIG. 5 a sectional side view of an antenna surface of the antenna model representing a front face of the antenna;

FIG. 6 a sectional side view of a first embodiment of a source model of a field source of the antenna model;

FIG. 7 a sectional side view of a second embodiment of a source model of a field source of the antenna model;

FIG. 8 a sectional side view of a third embodiment of a source model of a field source of the antenna model;

FIG. 9 a sectional side view of a fourth embodiment of a source model of a field source of the antenna model;

FIG. 10 an electric field simulated with the source model in its first embodiment; and FIG. 11 an electric field simulated with the source model in its third embodiment;

FIG. 12 a measured gain ratio of an antenna gain with interaction structure to an antenna gain without interaction structure;

FIG. 13 a simulated gain ratio of an antenna gain with interaction structure to an antenna gain without interaction structure FIG. 14 a further simulated gain ratio of an antenna gain with interaction structure to an antenna gain without interaction structure.

DETAILED DESCRIPTION

FIG. 1 depicts a front view of a vehicle integrated radar antenna 1 of a radar device used in automotive applications. The antenna 1 is configured as a planar slot antenna and comprises a planar electrode structure 10 with a planar slotted electrode 17 containing several slots 12. Each slot 12 represents a radiating element 11 of the electrode structure 10. The slots 12 are elongated in a longitudinal direction 2 of the antenna 1 and arranged in pairs next to each other in a lateral direction 3 that is perpendicular to the longitudinal direction 2. The longitudinal direction 2 and the lateral direction 3 represent transverse directions of the antenna 1.

The electrode structure 10 comprises several subsections, each of which represents a radiator 14 of the antenna 1. The radiators 14 are defined in a way that each radiator may be represented by a far field source when simulating electromagnetic interactions between the antenna 1 and an interaction structure (not shown) placed in front of the antenna 1. A central pair 13 of neighboring slots 12 of the electrode structure 10 is represented by a radiator 14 that comprises both neighboring slots 12. The remaining slots 12 are each represented by a radiator 14 that comprises one slot 12 only. According to an alternative embodiment, the individual slots 12 of the electrode structure 10 may also be decomposed into several radiators 14 in the longitudinal direction 2.

FIG. 2 depicts a sectional side view of the antenna 1 integrated behind a bumper 20 of a vehicle. The bumper 20 constitutes an interaction structure that scatters the electromagnetic radiation emitted by the antenna 1. As can be seen from FIG. 2, the antenna 1 comprises an electrode structure 10 with a planar dielectric substrate 15. The dielectric substrate 15 is oriented perpendicular to a forward direction 102. The bumper 20 is generally placed in a radiation direction of the antenna 1 so that the radiation emitted by the antenna 1 reaches the bumper 20. For example, the radiation may be directed towards the bumper 20. The bumper 20 is placed at a distance 22 from the electrode structure 10.

The forward direction 102 is oriented perpendicular to a transverse plane that is defined by the longitudinal direction 2 and the lateral direction 3 and is oriented parallel to the substrate 15. The electrode structure 10 further comprises the slotted electrode 17, which is placed on a front surface of the substrate 15 that is oriented towards the forward direction 102. On an opposite back surface of the substrate 15, the electrode structure 10 comprises a planar grounded electrode 18. Both the slotted electrode 17 and the grounded electrode 18 comprise a metal, for example copper. The electrode structure 10 of the antenna 1 is configured as a substrate integrated waveguide wherein the space between the electrodes 17, 18 that is filled by the substrate 15 serves as a hollow waveguide that is closed by metallic interconnections (not shown) through the substrate 15 in the lateral direction 3.

The plane, in which the radiating elements 11 are located, defines an antenna plane 101 of the antenna 1. In a cover distance 4 in the forward direction 102 from the antenna plane 101, a dielectric cover 5 is placed in front of the electrode structure 10. The cover 5 constitutes a radome of the antenna 1. The cover 5, the slotted electrode 17 and the air-filled gap formed between the cover 5 and the slotted electrode 17 form a reflecting front face 6 of the antenna 1. Electromagnetic radiation that is impinging from the forward direction 102 on the reflecting front face 6 is reflected at interfaces between the individual layers of the front face 6 that are formed by the cover 5, the air-filled gap and the slotted electrode 17.

The cover distance 4 is electrically short compared to the wavelength of the electromagnetic radiation emitted by the electrode structure 10, while the distance 22 to the bumper 20 is electrically long compared to said wavelength. Both the cover 5 and the bumper 20 are electrically thin and have a thickness in the forward direction 102 that is shorter than or comparable to the wavelength of the radiation emitted by the electrode structure 10. Additionally, the interaction structure that is formed by the bumper 20 is an electrically large structure in the transverse plane defined by the longitudinal direction 2 and the lateral direction 3 and extends in the transverse plane over distances of several or many wavelengths of the radiation emitted by the electrode structure 10.

FIG. 3 depicts an antenna model 100 that is used to simulate the electromagnetic interaction between the antenna 1 and the electrically large interaction structure formed by the bumper 20. The antenna model 100 comprises an antenna surface 110 and several field sources 120. Each field source 120 represents an individual radiator 14 of the electrode structure 10. The field sources 120 are configured as far field sources that are defined by a predetermined radiation pattern.

The antenna surface 110 of the antenna model 100 represents the reflecting front face 6 of the antenna 1. It comprises at least one opening 114, in which the individual field sources 120 are located. The individual field sources 120 may all be located in one opening 114 or one or several of the field sources 120 may be located in separate openings. For example, each field source 120 may be located in a separate opening. The opening 114 has a length 115 in the longitudinal direction 2 and a width 116 in the lateral direction 3 that are configured in a way that the minimum distance between the edges of the opening 114 and the field sources 120 located within the opening 114 corresponds to a minimum distance between radiation sources and material structures allowed by the asymptotic numerical method used to solve the interaction simulation model. According to an alternative embodiment, the antenna surface 110 may also have several openings 114, each of which comprises one or several of the field sources 120.

Referring to FIG. 1, the radiators 14 are defined in way that transverse dimensions 8 of the individual radiators 14 in the transverse directions 2, 3 are small enough that the bumper 20 is placed in the far field region of the individual radiators 14. In particular, the distance 22 between the bumper 20 and the antenna plane 101 is larger than the transverse dimensions 8 of the individual radiators 14, for example ten times, twenty times or one hundred times larger. Transverse dimensions 7 of the entire antenna 1 are comparable to or larger than the distance 22 between the antenna plane 101 and the bumper 20 so that the bumper 20 is placed in the near field region of the entire antenna 1. In addition, the cover 5 is placed in the near field region of the entire antenna 1 and in the near field region of the individual radiators 14.

As can be seen from FIG. 4, which shows a sectional side view of an interaction simulation model for simulating the interaction between the antenna 1 and the bumper 20, both the field sources 120 inside the opening 114 and the antenna surface 110 of the antenna model 100 are placed in the antenna plane 101. Besides the antenna model 100 with the antenna surface 110 and the field sources 120, the interaction simulation model comprises the interaction structure representing the bumper 20. This interaction structure is placed at the distance 22 from the antenna surface 110.

The antenna plane 101 containing the antenna surface 110 and the field sources 120 defines a forward open half space 104 that is located in the forward direction 102 from the antenna surface 110 and is bounded by the antenna plane 101. The forward open half space 104 does not contain the antenna plane 101 and the antenna surface 110. In a backward direction 105 that is opposing the forward direction 102, a backward open half space 106 is located that is also bounded by the antenna plane 101 and does not contain the antenna plane 101 and the antenna surface 110.

The predetermined radiation pattern defining the radiation field emitted by the individual field sources 120 is configured to contain non-zero field components only in the forward open half space 104. In the backward open half space 106 as well as along the antenna plane 101 and the antenna surface 110, the predetermined radiation pattern equals zero.

The electromagnetic interaction between the antenna 1 and the bumper 20 is simulated using an asymptotic numerical method. Based on the predetermined radiation pattern given by the field sources 120, electromagnetic rays or ray fields 30 are determined that originate from the individual field sources 120 and represent the radiation launched by the field sources 120. Subsequently, the electromagnetic rays or ray fields 30 are traced using a ray-tracing algorithm.

When impinging on an interaction structure, such as the bumper 20 or the antenna surface 110, interactions between the electromagnetic radiation with the structure are evaluated using equivalent surface integrals over tangential and/or normal field components. As the predetermined radiation pattern of the field sources 120 equals zero in the backward open half space 106 and along the antenna surface 110, no radiation or rays 30 are launched from the field sources 120 along the antenna surface 110 or in the backward direction 105.

The antenna surface 110 representing the reflecting front face 6 of the antenna 1 is modelled as a multilayered thin dielectric sheet. FIG. 5 depicts a schematic cross-sectional side view of the multilayered thin dielectric sheet of the antenna surface 110. While the dielectric sheet is shown expanded in FIG. 5 with a thickness greater than zero, it is geometrically represented by an infinitesimally thin two-dimensional sheet in the interaction simulation model shown in FIG. 4.

In the forward direction 102, the thin dielectric sheet sequentially comprises a first layer 111, a second layer 112 and a third layer 113, each of which is oriented perpendicular to the forward direction 102. The first layer 111 represents the slotted electrode 17 and has a first thickness 117, the second layer 112 represents the air-filled gap between the slotted electrode 17 and the cover 5 and has a second thickness 118 and the third layer 113 represents the cover 5 and has a third thickness 119. The thicknesses 117, 118, 119 and other material parameters of the individual layers 111, 112, 113 are adapted in way that a reflectivity of the thin dielectric sheet defining the antenna surface 110 matches a reflectivity of the reflective front face 6 of the antenna 1. Instead of a thin dielectric sheet representation, surface impedance or similar representations of the reflectivity properties of the front face 6 can be applied.

FIG. 6 depicts a sectional side view of a first embodiment of a source model 140 used to determine the predetermined radiation pattern of one of the field sources 120 of the antenna model 100. For every radiator 14 and field source 120, a separate source model 140 is constructed. The source model 140 comprises an elongated source element 141 and a material layer 144 consisting of a dielectric material. The source element 141 is elongated along the lateral direction 3 and is collocated with the antenna plane 101. The material layer 144 is oriented parallel to the antenna plane 101 and has a constant thickness 145 along the forward direction 102. The material layer 144 extends infinitely in the transverse plane perpendicular to the forward direction 102. Along the forward direction 102, it is bounded by a back surface 147 that faces towards the source element 141 and by a front surface 146 opposing the back surface 147. The material layer 144 is placed at a layer distance 143 from the antenna plane 101 and the antenna surface 110 coinciding with the antenna plane 101.

The source element 141 radiates in the forward direction 102 through the dielectric material layer 144. It is given by an aperture field inside the slot 12 represented by the source model 140. The aperture field may be obtained from a full wave simulation or from a method of moments simulation of the subsection of the electrode structure 10 that is represented by the radiator 14 for which the source model 140 is constructed. It may alternatively be obtained from a simulation of the full antenna, or a simulation of the full radar sensor and a subsequent extraction of the relevant field values. Alternatively, it may be obtained from an analytical representation of the electromagnetic field inside the slots 12 of the radiator 14 it represents.

Instead of an elongated source element 141, the source model 140 may also comprise a source element 141 that is configured as a point-like far field source which has been derived from a simulation of the subsection of the electrode structure 10 for which the source model 140 is constructed. Such a far field source may be called a preliminary far field source and is determined without the material layer 144 placed at the electrode structure 10.

The electromagnetic field radiated by the source element 141 is simulated in the full space surrounding the source element 141. Subsequently, a far field response of the source element 141 is extracted from the source model 140 as the predetermined radiation pattern. This far field response may be extracted as discretized field values on a spherical source surface 122 surrounding the source element 141 in the far field region of the emitted radiation field. The predetermined radiation pattern may also be analytically represented as an expansion in spherical modes. A center of the far field response, of the spherical source surface 122 or of the spherical modes is located in the plane of the antenna surface 110 and is collocated with the source element 141.

In the forward open half space 104 that is bounded by the antenna plane 101, the predetermined radiation pattern is defined by the simulated electromagnetic field radiated by the source element 141. In the antenna plane 101 that coincides with the antenna surface 110 and in the backward open half space 106, the predetermined radiation pattern is set to zero. Due to the material layer 144 being placed near the antenna plane 101, the simulated electromagnetic field that is radiated by the source element 141 vanishes in the antenna plane 101. Therefore, setting the predetermined radiation pattern to zero in the backward open half space 106 does not introduce a discontinuity of the predetermined radiation pattern on the antenna plane 101 and the antenna surface 110 coinciding with the antenna plane 101.

FIG. 7 depicts a sectional side view of a second embodiment of the source model 140. In the second embodiment, the material layer 144 is placed in the backward open half space 106 with its front surface 146 located at a layer distance 143 in the backward direction 105 from the antenna plane 101. The material layer 144 has an infinite thickness in the backward direction 105 and entirely fills the backward half space 106. Furthermore, it extends infinitely in the transverse plane and comprises an absorbing material.

In the second embodiment of the source model 140, the source element 141 radiates into the forward half space 104. Any backward scattering in the backward half space 106 is suppressed by the absorbing material layer 144 placed behind the source element 141.

After simulating the electromagnetic field radiated by the source element 141 of the second embodiment of the source model 140, the simulated electromagnetic field is extracted as the predetermined radiation pattern from the far field response of the source element 141 inside the full space surrounding the source element 141. In particular, the simulated electromagnetic field may be extracted on the entire spherical source surface 122 surrounding the source element 141. The absorbing material layer 144 thereby ensures that the far field components in the antenna plane 101 and in the backward half space 106 equal to zero.

FIG. 8 depicts a sectional side view of a third embodiment of the source model 140. As far as no differences are described, the third embodiment of the source model 140 is configured like the second embodiment. Like the second embodiment, the third embodiment of the source model 140 comprises a source element 141 that is collocated with the antenna plane 101 and radiates in the forward half space 104. The source model 140 further comprises an absorbing material layer 144 placed in the backward half space 106 at a layer distance 143 in the backward direction 105 from the antenna surface 110. Additionally, the material layer 144 has a finite thickness 145 in the backward direction 105. The predetermined radiation pattern is determined from the far field response of the source element 141 inside the full space surrounding the source element 141.

FIG. 9 depicts a sectional side view of a fourth embodiment of the source model 140. As far as no differences are described, the fourth embodiment of the source model 140 is configured like the third embodiment. In the fourth embodiment, the material layer 144 has a finite thickness 145 in the backward direction 105 and additionally comprises a conducting layer placed on the back surface 147 of the material layer 144. The conducting layer may be configured as a perfectly conducting layer or as a lossy conducting layer. Like with the third embodiment of the source model 140, the predetermined radiation pattern is determined from the far field response of resource element 141 inside the full space surrounding the source element 141.

FIG. 10 depicts the simulated electromagnetic far field 130 radiated by the source element 141 of the first embodiment of the source model 140 and FIG. 11 depicts the simulated electromagnetic far field 130 radiated by the source element 141 of the third embodiment of the source model 140. As can be seen, both far fields 130 contain non-zero field components only in the forward open half space 104 in front of the antenna plane 101 that coincides with the antenna surface 110.

With the antenna 1 shown in FIGS. 1 and 2, the bumper 20 is placed in the near field of the entire antenna 1. This means that the bumper 20 is placed in the near field of the entire set of radiating elements 11 and that the distance 22 between the antenna plane 101 and the bumper is smaller than $2D^2/\lambda$ with $\lambda$ being the wavelength of the radiation and D the transverse dimension 7 of the antenna 1 or the maximum distance between the individual radiating elements 11 in the longitudinal and lateral direction 2, 3. Additionally, both the entire antenna 1 and the bumper 20 are electrically large along the longitudinal direction 2 and/or the lateral direction 3.

With interaction structures, such as the bumper 20, that are placed in the near field of the entire antenna 1, it is not possible to accurately represent the entire antenna 1 by point sources that include the effects of the electrode structure 10 that is simulated by the antenna surface 110 in the context of the present disclosure. For example, it is not possible to include the effect caused by the entire slotted electrode 17 into a single point source or a set of point sources. When considering the antenna surface 110 only by inclusion into one or several point sources, the interaction between the bumper 20 and the electrode structure 10, for example a back reflection of radiation by the bumper 20 towards the electrode structure 10 and a subsequent reflection at the electrode structure 10, cannot be modeled. Therefore, inclusion of the finite antenna surface 110 in the calculation of an equivalent far field source would be incorrect, since a point source can represent only radiating structures that are small compared to the distance 22 to the bumper 20, otherwise physical conditions would be violated, i.e. the radiating structure would not represent a point source anymore.

This is illustrated by the data showed in FIGS. 12 to 14. These data show the impact of the bumper 20 on the gain of the antenna 1 by plotting the gain drop caused by the bumper, that is the ratio of antenna gain with bumper to antenna gain without bumper, versus angle of boresight 201 with respect to the forward direction 102.

FIG. 12 depicts a measured gain ratio 202 versus angle of boresight 201. The gain ratio 202 amounts to approximately −3.5 dB at an angle of boresight of 0° and levels out to 0 dB at angles of boresight of +/−90°. FIG. 13 shows a simulated gain ratio 203, which has been obtained using the antenna model 100 described herein, that is by explicitly considering the antenna surface 110 without inclusion into the definition of the equivalent point sources and by defining the radiators 14 represented by the equivalent point sources 120 in way that places the bumper 20 in the far field of the individual radiators. The simulated gain ratio 203 accurately reproduces the measured gain ratio 202, for example for angles of boresight 201 between −60° and +60°. For comparison, FIG. 14 shows a simulated gain ratio 204 that has been obtained by including the entire electrode structure 10 into the definition of the point sources 120. The simulated gain ratio 204 exhibits completely nonphysical oscillations and fails to reproduce the measured gain ratio 202 shown in FIG. 12.

The method for simulating the interactions between the antenna 1 and the interaction structure 20 described herein uses a purely asymptotic numerical method (e.g. RL-GO) and includes the entire antenna 1 by using equivalent point sources 120 of this asymptotic method. It is therefore much more efficient (less computationally demanding) compared to hybrid numerical methods that only model the interaction with the bumper 20 with an asymptotic numerical method and rely on a different numerical method, such as a MOM/MLFMM technique, for simulating the antenna 1.

Enumerated Embodiments

The present disclosure is, inter alia, directed at the following enumerated embodiments:

1. Method for simulating electromagnetic interactions between an antenna (1) and an electrically large interaction structure (20) placed in a radiation direction in front of the antenna (1),
wherein the antenna (1) comprises a reflecting front face (6) and at least one radiating element (11),
the method comprising:
  providing, in a memory unit of a computer, an antenna model (100) representing the antenna (1), the antenna model (100) comprising
an antenna surface (110) representing the reflecting front face (6) of the antenna (1) and
at least one field source (120) representing at least one electromagnetic radiator (14) of the antenna (1),
wherein the at least one electromagnetic radiator (14) is defined as a part of the antenna (1) that at least partly comprises the radiating element (11) and that has dimensions that place the interaction structure (20) in the far field region of the radiator (14);
wherein the field source (120) is placed at the antenna surface (110),
wherein the field source (120) is configured as a far field source (120) that is defined by a predetermined radiation pattern,
wherein a radiation field of the radiation pattern that is directed towards the antenna surface (110) is at least approximately equal to zero so that direct electromagnetic interaction between the field source (120) and the antenna surface (110) is avoided;
  computing, with a processing unit of the computer, electromagnetic radiation launched by the field source (120) based on the predetermined radiation pattern;
  propagating, with the processing unit of the computer, the radiation in the radiation direction using an asymptotic numerical method; and
  determining, with the processing unit of the computer, interactions of the radiation with the interaction structure (20) and with the antenna surface (110).

2. The method according to embodiment 1,
wherein the antenna surface (110) comprises an opening (114),
wherein the field source (120) is placed inside the opening (114), for example in a plane defined by the antenna surface (110).

3. The method according to one of the preceding embodiments,
wherein the radiation pattern is continuous in a volume surrounding the field source (120).

4. The method according to one of the preceding embodiments,
wherein the antenna surface (110) has a reflectivity that is smaller than 100%.

5. The method according to one of the preceding embodiments,
wherein the antenna surface (110) has a multilayered dielectric material, for example a first layer (111) comprising a reflective material with a reflectivity smaller than 100% and/or a second layer (112) comprising air and/or a third layer (113) comprising a dielectric material.

6. The method according to one of the preceding embodiments,
wherein the antenna surface (110) is configured as an infinitesimally thin two-dimensional sheet.

7. The method according to one of the preceding embodiments,
wherein the method comprises:
  obtaining reference reflectivity values of the front face (6) of the antenna (1), for example by performing a measurement of electromagnetic reflection by the front face (6) or by performing a full wave simulation of electromagnetic reflection by the front face (6);
  obtaining simulated reflectivity values by simulating, with the processing unit of the computer, electromagnetic reflection off the antenna surface (110) of the antenna model (100) using the asymptotic numerical method; and
  adapting electromagnetic parameters of the antenna surface (110) of the antenna model (100) to reproduce the reference reflectivity values of the front face (6) of the antenna (1) by the simulated reflectivity values.

8. The method according to one of the preceding embodiments,
wherein the antenna (1) comprises an electrode structure (10) having several radiating elements (11),
wherein the interaction structure (20) is positioned in the near field region of the entire electrode structure (10),
wherein the antenna model (100) comprises a plurality of far field sources (120), each far field source (120) representing one of a plurality of individual radiators (14),
wherein the plurality of radiators (14) comprises the at least one radiator (14),
wherein each radiator (14) represents a part of the electrode structure (10) that has dimensions that place the interaction structure (20) in the far field region of the radiator (14),
wherein each far field source (120) is defined by a predetermined radiation pattern with a radiation field directed towards the antenna surface (110) at least approximately being equal to zero so that direct electromagnetic interaction between the field sources (120) and the antenna surface (110) is avoided.

9. The method according to one of the preceding embodiments, further comprising:
  providing, in a memory unit of a computer, a source model (140) comprising a source element (141) that represents the radiator (14) and a material layer (144) that is placed at the source element (141) and extends parallel to the antenna surface (110);
  simulating, by a processing unit of the computer, an electromagnetic radiation field radiated into full space using the source model (140); and
  extracting, by the processing unit of the computer, far field components of the radiation field as the predetermined radiation pattern at least in a forward open half space (104) bounded by an antenna plane (101) that is parallel to the antenna surface (110).

10. The method according to embodiment 9,
wherein the material layer (144) comprises a dielectric and/or an absorbing material.

11. The method according to one of embodiments 9 to 10,
wherein the material layer (144) has finite thickness (145) in a direction (102) perpendicular to the antenna plane (110) and is placed in front of the source element (141) inside the forward open half space (104) bounded by the antenna plane (101).

12. The method according to one of embodiments 9 to 10,
wherein the material layer (144) is placed behind the source element (141) inside a backward open half space (106) that is bounded by the antenna plane (101) and opposes the forward open half space (104).

13. The method according to one of embodiments 9 to 12, comprising:
   determining a reference radiation pattern radiated by the radiator (14) of the antenna (1); and
   adapting electromagnetic parameters of the material layer (144), such as a dielectric constant, a loss tangent, a layer thickness, a number of layers, or the like, to reproduce the reference radiation pattern by the simulated electromagnetic radiation field radiated by the source model (140).

14. The method according to one of the preceding embodiments,
wherein the method comprises:
   determining, with the processing unit of the computer, interactions of the radiation with additional interaction structures that are directly and/or indirectly irradiated by the radiation launched by the field source (120) and, optionally, by radiation launched by additional field sources (120),
wherein the additional interaction structures are located in a forward direction (102) from the antenna surface (110) and/or in a backward direction (105) from the antenna surface (110) and/or to the side of the field source (120) or the field sources (120).

15. Method for simulating electromagnetic interactions between an antenna (1) and an electrically large interaction structure (20) placed in a radiation direction in front of the antenna (1),
wherein the antenna (1) comprises a reflecting front face (6) and several radiating elements (11),
wherein the interaction structure (20) is positioned in the near field region of the entire antenna (1),
wherein the method comprises:
   providing, in a memory unit of a computer, an antenna model (100) representing the antenna (1), the antenna model (100) comprising
an antenna surface (110) representing the reflecting front face (6) of the antenna (1) and
a plurality of far field sources (120), each far field source (120) representing one of a plurality of individual radiators (14) of the antenna (1),
wherein each radiator (14) represents a part of the antenna (1) that has dimensions that place the interaction structure (20) in the far field region of the respective radiator (14),
wherein the far field sources (120) are placed at the antenna surface (110);
   computing, with a processing unit of the computer, electromagnetic radiation launched by the field sources (120);
   propagating, with the processing unit of the computer, the radiation in the radiation direction using an asymptotic numerical method; and
   determining, with the processing unit of the computer, interactions of the radiation with the interaction structure (20) and with the antenna surface (110).

16. The method according to embodiment 15,
wherein each far field source (120) is defined by a respective predetermined radiation pattern,
wherein the electromagnetic radiation launched by the individual field sources (120) is based on their respective predetermined radiation pattern.

17. The method according to embodiment 16,
wherein each predetermined radiation pattern has a radiation field directed towards the antenna surface (110) that is at least approximately equal to zero so that direct electromagnetic interaction between the field sources (120) and the antenna surface (110) is avoided.

18. The method according to one of embodiments 15 to 17,
wherein the antenna surface (110) comprises an opening (114),
wherein at least one of the field sources (120) is placed inside the opening (114).

19. Computer system, the computer system being configured to carry out the method of at least one of embodiments 1 to 18.

20. Computer program for instructing a computer to perform the method of at least one of embodiments 1 to 18.

REFERENCE NUMERAL LIST 1 antenna
2 longitudinal direction
3 lateral direction
4 cover distance
5 cover
6 front face
7 dimension
8 dimension
10 electrode structure
11 radiating element
12 slot
13 central pair
14 radiator
15 substrate
17 slotted electrode
18 grounded electrode
20 interaction structure
22 distance
30 ray
100 antenna model
101 antenna plane
102 forward direction
104 forward half space
105 backward direction
106 backward half space
110 antenna surface
111 first layer
112 second layer
113 third layer
114 opening
115 length
116 width
117 first thickness
118 second thickness
119 third thickness
120 field source
122 source surface
130 simulated electromagnetic field
140 source model
141 source element
143 distance
144 material layer
145 thickness of material layer
146 front surface
147 back surface
201 angle of boresight
202 measured gain ratio
203 simulated gain ratio
204 simulated gain ratio

The invention claimed is:

1. Method for simulating electromagnetic interactions between an antenna and an electrically large interaction structure placed in a radiation direction in front of the antenna, wherein the antenna comprises a reflecting front face and at least one radiating element, the method comprising:

providing, in a memory unit of a computer, an antenna model representing the antenna, the antenna model comprising an antenna surface representing the reflecting front face of the antenna and at least one field source representing at least one electromagnetic radiator of the antenna, wherein the at least one electromagnetic radiator is defined as a part of the antenna that at least partly comprises the radiating element and that has dimensions that place the interaction structure in the far field region of the radiator;

wherein the field source is placed at the antenna surface, wherein the field source is configured as a far field source that is defined by a predetermined radiation pattern, wherein a radiation field of the radiation pattern that is directed towards the antenna surface is at least approximately equal to zero so that direct electromagnetic interaction between the field source and the antenna surface is avoided;

computing, with a processing unit of the computer, electromagnetic radiation launched by the field source based on the predetermined radiation pattern;

propagating, with the processing unit of the computer, the radiation in the radiation direction using an asymptotic numerical method; and determining, with the processing unit of the computer, interactions of the radiation with the interaction structure and with the antenna surface.

2. The method according to claim 1,
wherein the antenna surface comprises an opening,
wherein the field source is placed inside the opening.

3. The method according to claim 1,
wherein the radiation pattern is continuous in a volume surrounding the field source.

4. The method according to claim 1,
wherein the antenna surface has a reflectivity that is smaller than 100%.

5. The method according to claim 1,
wherein the antenna surface has a multilayered dielectric material.

6. The method according to claim 1,
wherein the antenna surface is configured as an infinitesimally thin two-dimensional sheet.

7. The method according to claim 1,
wherein the method comprises:

obtaining reference reflectivity values of the front face of the antenna;

obtaining simulated reflectivity values by simulating, with the processing unit of the computer, electromagnetic reflection off the antenna surface of the antenna model using the asymptotic numerical method; and adapting electromagnetic parameters of the antenna surface of the antenna model to reproduce the reference reflectivity values of the front face of the antenna by the simulated reflectivity values.

8. The method according to claim 1,
wherein the antenna comprises an electrode structure having several radiating elements,
wherein the interaction structure is positioned in the near field region of the entire electrode structure,
wherein the antenna model comprises a plurality of far field sources, each far field source representing one of a plurality of individual radiators,
wherein the plurality of radiators comprises the at least one radiator, wherein each radiator represents a part of the electrode structure that has dimensions that place the interaction structure in the far field region of the radiator,
wherein each far field source is defined by a predetermined radiation pattern with a radiation field directed towards the antenna surface at least approximately being equal to zero so that direct electromagnetic interaction between the field sources and the antenna surface is avoided.

9. The method according to claim 1, further comprising:
providing, in a memory unit of a computer, a source model comprising
a source element that represents the radiator and
a material layer that is placed at the source element and extends parallel to the antenna surface;
simulating, by a processing unit of the computer, an electromagnetic radiation field radiated into full space using the source model; and
extracting, by the processing unit of the computer, far field components of the radiation field as the predetermined radiation pattern at least in a forward open half space bounded by an antenna plane that is parallel to the antenna surface.

10. The method according to claim 9,
wherein the material layer comprises a dielectric and/or an absorbing material.

11. The method according to claim 9,
wherein the material layer has finite thickness in a direction perpendicular to the antenna plane and is placed in front of the source element inside the forward open half space bounded by the antenna plane.

12. The method according to claim 9,
wherein the material layer is placed behind the source element inside a backward open half space that is bounded by the antenna plane and opposes the forward open half space.

13. The method according to claim 9, comprising:
determining a reference radiation pattern radiated by the radiator of the antenna; and
adapting electromagnetic parameters of the material layer, such as a dielectric constant, a loss tangent, a layer thickness, a number of layers, or the like, to reproduce the reference radiation pattern by the simulated electromagnetic radiation field radiated by the source model.

14. The method according to claim 1,
wherein the method comprises:

determining, with the processing unit of the computer, interactions of the radiation with additional interaction structures that are directly and/or indirectly irradiated by the radiation launched by the field source, wherein the additional interaction structures are located in a forward direction from the antenna surface and/or in a backward direction from the antenna surface and/or to the side of the field source or the field sources.

15. Method for simulating electromagnetic interactions between an antenna and an electrically large interaction structure placed in a radiation direction in front of the antenna, wherein the antenna comprises a reflecting front face and several radiating elements, wherein the interaction structure is positioned in the near field region of the entire antenna, wherein the method comprises:

providing, in a memory unit of a computer, an antenna model representing the antenna, the antenna model comprising an antenna surface representing the reflecting front face of the antenna and a plurality of far field sources, each far field source representing one of a plurality of individual radiators of the antenna, wherein each radiator represents a part of the antenna that has dimensions that place the interaction structure in the far field region of the respective radiator, wherein the far field sources are placed at the antenna surface;

computing, with a processing unit of the computer, electromagnetic radiation launched by the field sources;

propagating, with the processing unit of the computer, the radiation in the radiation direction using an asymptotic numerical method; and determining, with the processing unit of the computer, interactions of the radiation with the interaction structure and with the antenna surface.

16. The method according to claim 15, wherein each far field source is defined by a respective predetermined radiation pattern, wherein the electromagnetic radiation launched by the individual field sources is based on their respective predetermined radiation pattern.

17. The method according to claim 16, wherein each predetermined radiation pattern has a radiation field directed towards the antenna surface that is at least approximately equal to zero so that direct electromagnetic interaction between the field sources and the antenna surface is avoided.

18. The method according to claim 15, wherein the antenna surface comprises an opening, wherein at least one of the field sources is placed inside the opening.

* * * * *